United States Patent [19]
Kato et al.

[11] Patent Number: 5,616,940
[45] Date of Patent: Apr. 1, 1997

[54] SEMICONDUCTOR SEMICUSTOM-MADE INTEGRATED CIRCUIT DEVICE HAVING COMPONENT TRANSISTORS VARIABLE IN GAIN FOR FORMING BASIC CELL

[75] Inventors: Hiroyuki Kato; Takaharu Ito, both of Kanagawa, Japan

[73] Assignee: NEC Corporation, Tokyo, Japan

[21] Appl. No.: 495,000

[22] Filed: Jun. 27, 1995

[30] Foreign Application Priority Data

Jun. 27, 1994 [JP] Japan .................................. 6-144224

[51] Int. Cl.$^6$ .............................. H01L 27/02; H01L 27/10
[52] U.S. Cl. ........................... 257/206; 257/202; 257/401
[58] Field of Search ..................................... 257/206, 204, 257/202, 369, 390, 401

[56] References Cited

U.S. PATENT DOCUMENTS

| | | | |
|---|---|---|---|
| 5,055,716 | 10/1991 | El Gamel | 257/206 |
| 5,144,388 | 9/1992 | Sawada et al. | 257/401 |
| 5,164,811 | 11/1992 | Tamura | 257/206 |
| 5,187,556 | 2/1993 | Nariishi et al. | 257/206 |
| 5,289,021 | 2/1994 | El Gamal | 257/206 |
| 5,331,192 | 7/1994 | Kudoh | 257/401 |
| 5,341,013 | 8/1994 | Koyanagi et al. | 257/401 |
| 5,367,187 | 11/1994 | Yuen | 257/206 |
| 5,444,275 | 8/1995 | Kugishima et al. | 257/401 |
| 5,479,034 | 12/1995 | Hashimoto et al. | 257/202 |
| 5,510,636 | 4/1996 | Murata | 257/206 |
| 5,539,246 | 7/1996 | Kapoor | 257/401 |

FOREIGN PATENT DOCUMENTS

| | | | |
|---|---|---|---|
| 0020365 | 1/1987 | Japan | 257/401 |
| 0244148 | 10/1987 | Japan | 257/206 |
| 0168673 | 6/1990 | Japan | 257/401 |
| 0266563 | 10/1990 | Japan | 257/206 |
| 0309673 | 12/1990 | Japan | 257/206 |
| 4-99064 | 3/1992 | Japan . | |

Primary Examiner—Sara W. Crane
Assistant Examiner—David B. Hardy
Attorney, Agent, or Firm—Foley & Lardner

[57] ABSTRACT

A basic cell of gate array has a plurality of p-channel type field effect transistors and a plurality of n-channel type field effect transistors available for electric circuits different in configuration; although gate electrodes are physically separated, a p-channel type field effect transistor and an n-channel type field effect transistor share a p-type source/drain area and an n-type source/drain area with another p-channel type field effect transistor different in channel width from the p-channel type field effect transistor and another n-channel type field effect transistor also different in channel width from the n-channel type field effect transistor so as to selectively use the p-channel type field effect transistors and the n-channel type field effect transistors, and the shared source/drain regions effectively decrease the occupation areas of the field effect transistors.

11 Claims, 24 Drawing Sheets

SEMICONDUCTOR SEMICUSTOM-MADE INTEGRATED CIRCUIT DEVICE HAVING COMPONENT TRANSISTORS VARIABLE IN GAIN FOR FORMING BASIC CELL

FIELD OF THE INVENTION

This invention relates to a semiconductor semicustom-made integrated circuit device and, more particularly, to a semiconductor semicustom-made integrated circuit device such as a gate array having component transistors variable in gain for forming basic cells.

DESCRIPTION OF THE RELATED ART

The gate array is implemented by an array of basic cells fabricated on a semiconductor wafer, and each basic cell includes a plurality of transistors for forming a fundamental logic gate such as a NAND gate or a NOR gate. When a customer provides a design specification, the manufacturer designs suitable circuits, and patterns wirings appropriately connecting the transistors. Thus, the manufacturer previously fabricates the transistors on the semiconductor wafer, and tailors the wirings after the purchase order of a customer. For this reason, the manufacturer quickly supplies the semiconductor semicustom-made integrated circuit device to the customer.

In general, a field effect transistor forming a part of the fundamental logic gate is designed to have a channel length as short as possible under the applied design rules so as to accelerate the switching speed of the field effect transistor. The channel width is determined depending upon an expected gain.

The occupation area of the basic cell determines the integration density of the gate array, and a key point of the development effort on the gate array is how the occupation area is minimized.

As described hereinbefore, the fundamental logic gates are used for the semicustom-made integrated circuit device, and, accordingly, the semicustom-made integrated circuit device usually achieves a task through a logical function. However, some customers request their semicustom-made integrated circuits to have a data storage facility, and a part of the basic cell array is available for memory cells each storing a data bit.

FIG. 1 illustrates the layout of the basic cell, and the equivalent circuit is shown in FIG. 2. Although the basic cell is covered with an inter-level insulating layer, the inter-level insulating layer and gate oxide layers are deleted from FIG. 1, and gate electrodes are hatched for clearly understanding the layout.

The prior art gate array is fabricated on a part of a semiconductor wafer 1 serving as a substrate, and a thick field oxide layer 2 defines n-type source/drain regions 1a, p-type source/drain regions 1b formed in an n-type well 1c, another n-type source/drain regions 1d and yet another n-type source/drain regions 1e. A pair of gate electrodes 1f/1g extend over channel regions between the n-type source/drain regions 1a, and forms a pair of n-channel type field effect transistors Qn1/Qn2. Another pair of gate electrodes 1h/1i is shared between the p-type source/drain regions 1b and the n-type source/drain regions 1d, and a pair of p-channel type field effect transistors Qp3/Qp4 and a pair of n-channel type field effect transistors Qn5/Qn6 are formed on the p-type source/drain regions 1b and the n-type source/drain regions 1d, respectively. A pair of gate electrodes 1j/1k forms a pair of n-channel type field effect transistors Qn7/Qn8 together with the n-type source/drain regions 1e. Contact holes 1m and 1n are provided beside the n-type source/drain regions 1a and 1e for biasing the substrate, and the n-type well 1c is associated with a contact hole 1o.

The field effect transistors Qp3/Qp4 and Qn5/Qn6 are available for fabricating a two-input NAND gate, and FIGS. 3 and 4 illustrate a wiring arrangement for the two-input NAND gate and an equivalent circuit.

Dots are indicative of contacts, and real lines represent wirings in FIG. 3. A positive power supply line Vdd is connected through source contact holes 3a and 3b to the p-type source regions of the p-channel type field effect transistors Qp3 and Qp4, and a wiring 4a connects the p-type common drain region of the p-channel type field effect transistors Qp3 and Qp4 through drain contact holes 3c and 3d to the n-type drain region of the n-channel type field effect transistor Qn5. The p-type common drain region of the p-channel type field effect transistors Qp3 and Qp4 is further connected through a drain contact hole 3e to an output signal line 4b.

The n-channel type field effect transistors Qn5 and Qn6 are coupled in series, and the n-type source region of the n-channel type field effect transistor Qn6 is connected through a source contact hole 3f to a ground voltage line GND. The common gate electrodes 1h and 1i are connected through gate contact holes 3g and 3h to input signal lines 4c and 4d, respectively.

When one of the input signal lines 4c and 4d is changed to a positive high voltage level equivalent to logic "1" level and the other remains in the ground voltage level equivalent to logic "0" level, one of the n-channel type field effect transistors Qn5/Qn6 turns off, and electrically isolates the output signal line 4b from the ground voltage line GND. On the other hand, one of the p-channel type field effect transistors Qp3 and Qp4 turns on, and electrically connects the positive power voltage line Vdd to the output signal line 4b. As a result, logic "1" appears on the output signal line 4b.

When both of the input signal lines 4c and 4d are logic "0" level, the n-channel type field effect transistors Qn5 and Qn6 isolate the output signal line 4b from the ground voltage line GND, and both p-channel type field effect transistors Qp3 and Qp4 supplies the positive power voltage level or logic "1" level to the output signal line 4b.

On the other hand, if both input signal lines 4c and 4d are in logic "1" level, both p-channel type field effect transistors Qp3 and Qp4 turn off, and both n-channel type field effect transistors Qn5 and Qn6 turn on. As a result, the output signal line 4b is electrically isolated from the positive power voltage line Vdd, and is grounded through the series of n-channel type field effect transistors Qn5 and Qn6, thereby producing logic "0" level.

Thus, the part of the prior art gate array achieves the NAND operation.

The part of the prior art gate array shown in FIGS. 1 and 2 is available for a flip-flop type memory cell, and FIGS. 5 and 6 illustrates a layout and an equivalent circuit of the flip-flop type memory cell.

A positive power voltage line Vdd is connected through a source contact hole 5a to a p-type common source region of the p-channel type field effect transistors Qp3 and Qp4, and the positive power voltage is supplied to the p-channel type field effect transistors Qp3 and Qp4. A first-level wiring 6a connects the p-type drain region of the p-channel type field effect transistor Qp3 through drain contact holes 5b and 5c to the n-type drain region of the n-channel type field effect transistor Qn5 which in turn is connected through a first-level wiring 6b and a gate contact hole 5d to the gate electrode 1i.

On the other hand, the p-type drain region of the p-channel type field effect transistor Qp4 connected through a drain contact hole 5e to a first-level wiring 6c, and the first-level is connected through a drain contact hole 5f to the n-type drain region of the n-channel type field effect transistor Qn6 and through a gate contact hole 5g to the gate electrode 1h.

The n-type common source region of the n-channel type field effect transistors Qn5 and Qn6 is connected through a source contact hole 5h to a ground voltage line GND. Thus, the series combinations of p-channel type field effect transistors Qp3/Qp4 and n-channel type field effect transistors Qn5/Qn6 are coupled between the positive power voltage line Vdd and the ground voltage line GND.

A pair of bit lines BLa and BLb is associated with the flip-flop type memory cell. The bit line BLa is connected through a source/drain contact hole 5i to the n-type source/drain region of the n-channel type field effect transistor Qn8, and the other n-type source/drain region of the n-channel type field effect transistor Qn8 is connected through a source/drain contact hole 5i to a first-level wiring 6d. The first-level wiring 6d is connected through a gate contact hole 5j to the gate electrode 1h, and the gate electrode 1h relays the potential level at the other n-type source/drain region to the p-type drain region of the p-channel type field effect transistor Qp4.

On the other hand, the bit line BLb is connected through a source/drain contact hole 5k to the n-type source/drain region of the n-channel type field effect transistor Qn2, and the other n-type source/drain region of the n-channel type field effect transistor Qn2 is connected through a source/drain contact hole 5m to a first-level wiring 6e. The first-level wiring 6e is connected through a gate contact hole 5n to the gate electrode 1i, and the gate electrode 1i relays the potential level at the other n-type source/drain region through the first-level wiring 6b to the p-type drain region of the p-channel type field effect transistor Qn5.

A word line WL1 extends on a second level, and is connected through gate contact holes 5o and 5p and a first-level wiring 6f to the gate electrodes 1g and 1k so that the n-channel type field effect transistors Qn2 and Qn8 concurrently turn on and off depending upon the potential level on the word line WL1.

A data bit is represented by a potential difference, and the flip-flop type memory cell behaves as follows. When the data bit is written into the flip-flop type memory cell, the potential difference is applied to the pair of bit lines BLa/BLb, and the potential level on the bit line BLb is assumed to be higher than the potential level on the other bit line BLa.

The word line WL1 is changed to an active high level, and the n-channel type field effect transistors Qn2 and Qn8 concurrently turn on so as to transfer the potential difference on the bit line pair BLb/BLa to the gate electrodes 1i and 1h. Then, the p-channel type field effect transistor Qp3 turns on, and the other p-channel type field effect transistor Qp4 turns off. On the other hand, the n-channel type field effect transistor Qn6 turns on, and the other n-channel type field effect transistor Qn5 turns off. The p-channel type field effect transistor Qp3 supplies the high potential level to the gate electrode 1i, and the n-channel type field effect transistor Qn6 supplies the low potential level to the gate electrode 1h. As a result, the status of the field effect transistors Qp3, Qp4, Qn5 and Qn6 is not changed after a recovery of the word line WL1. Thus, the potential difference indicating the data bit is stored in the flip-flop type memory cell.

If a data bit is represented by the high potential level on the bit line BLa, the p-channel type field effect transistor Qp4 and the n-channel type field effect transistor Qn5 turn on, and supply the high potential level and the low potential level to the gate electrodes 1h and 1i, respectively. The status of the field effect transistors Qp3, Qp4, Qn5 and Qn6 is maintained after the recovery of the word line WL1 to the inactive low level, and the data bit represented by the opposite potential levels is stored in the flip-flop type memory cell.

The data bit is read out from the flip-flop type memory cell to the bit line pair BLa and BLb. Namely, when the word line WL1 is changed to the active high level, the n-channel type field effect transistors Qn2 and Qn8 turn on, and the potential difference between the gate electrodes 1h and 1i is transferred through the n-channel type field effect transistors Qn8 and Qn2 to the bit lines BLa and BLb.

As described hereinbefore, the field effect transistors Qp3, Qp4, Qp5 and Qp6 are designed to achieve a high switching speed in a logic gate, and the p-channel type field effect transistors Qp3 and Qp4 are wider in channel width than the n-channel type field effect transistors Qn5 and Qn6 so as to concurrently change the output potential levels of the CMOS inverters Qp3/Qn5 and Qp4/Qn6.

The write-in/read-out characteristics of the flip-flop type memory cell are mainly affected by the n-channel type field effect transistors Qn2 and Qn8, and the p-channel type field effect transistors Qp3 and Qp4 merely maintain the potential difference. However, the p-channel type field effect transistors Qp3 and Qp4 designed for the logic gate are too large in channel width or gain to quickly transfer the potential difference on the bit line pair BLa/BLb to the gate electrodes 1h and 1i. For this reason, the prior art gate array available for both of the logic gate and the flip-flop type memory cell are designed to increase the channel width of the n-channel type field effect transistors Qn2 and Qn8, and the large n-channel type field effect transistors Qn2 and Qn8 compensate the delay due to the large p-channel type field effect transistors Qp3 and Qp4.

Although the large n-channel type field effect transistors Qn2 and Qn8 are effective against the deterioration of the write-in characteristics, the basic cell occupies wider real estate, and a large amount of parasitic capacitance is coupled to each of the n-channel type field effect transistors Qn2 and Qn8. The wide occupation area results in a smaller integration density, and the large parasitic capacitance retards the signal propagation to the n-channel type field effect transistor Qn2/Qn8.

Another prior art solution is a boosting circuit provided for the word line WL1. The boosting circuit raises the active high level on the word line WL1, and the higher potential level on the word line WL1 increases the channel conductance of the n-channel type field effect transistors Qn2 and Qn8. For this reason, the n-channel type field effect transistors Qn2 and Qn8 can compensate the delay due to the large p-channel type field effect transistors Qp3 and Qp4 without the increase of the channel width. However, this solution requires the boosting circuit used for the flip-flop type memory cells only, and the boosting circuit is wasteful of the real estate for the semicustom-made integrated circuit without a data storage.

Japanese Patent Publication of Unexamined Application No. 4-99064 discloses an approach for solving the problems inherent in the above described solutions, and FIGS. 7 and 8 illustrate the layout of the basic cell and the equivalent circuit disclosed in the Japanese Patent Publication. An inter-level insulating layer and thin gate oxide layers are deleted from the layout shown in FIG. 7, and gate electrodes are hatched for clear discrimination.

The basic cell of the prior art gate array is fabricated on a part of a semiconductor wafer 11 serving as a semiconductor substrate, and an n-type well 11a and n-type source/drain regions 11b, 11c and 11d are formed in the semiconductor substrate. A narrow p-type source/drain regions 11e and a wide p-type source/drain regions 11f are defined in the n-type well 11a, and form a pair of small p-channel type field effect transistors Qp10/Qp11 and a pair of large p-channel type field effect transistors Qp12/Qp13 together with gate electrodes 11g and 11h.

The n-type source/drain regions 11b are assigned to a pair of n-channel type field effect transistors Qn14/Qn15, and the gate electrodes 11g and 11h are further shared with the n-channel type field effect transistors Qn14/Qn15. The n-type source/drain regions 11c and the n-type source/drain regions 11d are respectively assigned to a pair of n-channel type field effect transistors Qn16/Qn17 and a pair of n-channel type field effect transistors Qn18/Qn19, and gate electrodes 11i and 11j are shared between the pair of n-channel type field effect transistors Qn16/Qn17 and the pair of n-channel type field effect transistors Qn18/Qn19.

The p-channel type field effect transistors Qp12/Qp13 and the n-channel type field effect transistors Qn14/Qn15 are used for a logic gate, and the small p-channel type field effect transistors Qp10 and Qp11 are available for a flip-flop circuit together with the n-channel type field effect transistors Qn14 and Qn15.

The large p-channel type field effect transistors Qp12 and Qp13 and the small p-channel type field effect transistors Qp10 and Qp11 are selectively used in an electric circuit, i.e., a logic gate or a flip-flop type memory cell depending upon a gain to be required.

When the basic cell is used for the flip-flop type memory cell, the wiring arrangement is shown in FIGS. 9 and 10. In FIG. 9, real lines are representative of first-level wirings, and broken lines represent second-level wirings. Dots and boxes are indicative of the locations of contact holes, and a positive power voltage line, a ground voltage line, a word line and bit lines are labeled with Vdd, GND, WL1 and BLa/BLb, respectively.

The small p-channel type field effect transistors Qp10 and Qp11 are used in the flip-flop type memory cell instead of the large p-channel type field effect transistors Qp12 and Qp13. For this reason, the write-in characteristics are improved without the enlargement of the n-channel type field effect transistors Qn17 and Qn18 or the boosting circuit, and a margin of the discriminative logic level is increased.

However, the prior art gate array still encounters a problem in a large occupation area of the basic cell, because the pair of p-channel type field effect transistors Qp10 and Qp11 requires additional p-type source/drain regions 11e separated from the p-type source/drain regions 11f of the p-channel type field effect transistors Qp12/Qp13. As a result, the prior art gate array suffers from a low integration density.

SUMMARY OF THE INVENTION

It is therefore an important object of the present invention to provide a semiconductor semicustom-made integrated circuit device which is improved in integration density without sacrifice of the flexibility in a gain.

To accomplish the object, the present invention proposes to separate a gate electrode of a small transistor from a gate electrode of a large transistor both patterned over a common source/drain area.

In accordance with the present invention, there is provided a semiconductor semicustom-made integrated circuit device fabricated on a semiconductor chip of a first conductivity type and comprising at least one basic cell available for circuit configurations different from one another, the at least one basic cell including: a first source and drain area formed in a first area of the semiconductor substrate and having a second conductivity type opposite to the first conductivity type; a first gate electrode means provided over a first sub-area of the first source and drain area for forming a first transistor means; a second gate electrode means provided over a second sub-area of the first source and drain area for forming a second transistor means different in channel width from the first transistor means; a well of the second conductivity type formed in a second area of the semiconductor substrate spaced from the first source and drain area; a second source and drain area of the first conductivity type formed in the well; a third gate electrode means connected to the second gate electrode means and provided over a third sub-area of the second source and drain area for forming a third transistor means; and a fourth gate electrode means provided over a fourth sub-area of the second source and drain area for forming a fourth transistor means different in channel width from the third transistor means.

BRIEF DESCRIPTION OF THE DRAWINGS

The features and advantages of the semiconductor semicustom-made integrated circuit device according to the present invention will be more clearly understood from the following description taken in conjunction with the accompanying drawings in which.

DESCRIPTION OF THE PREFERRED EMBODIMENTS

First Embodiment

Figure 11:
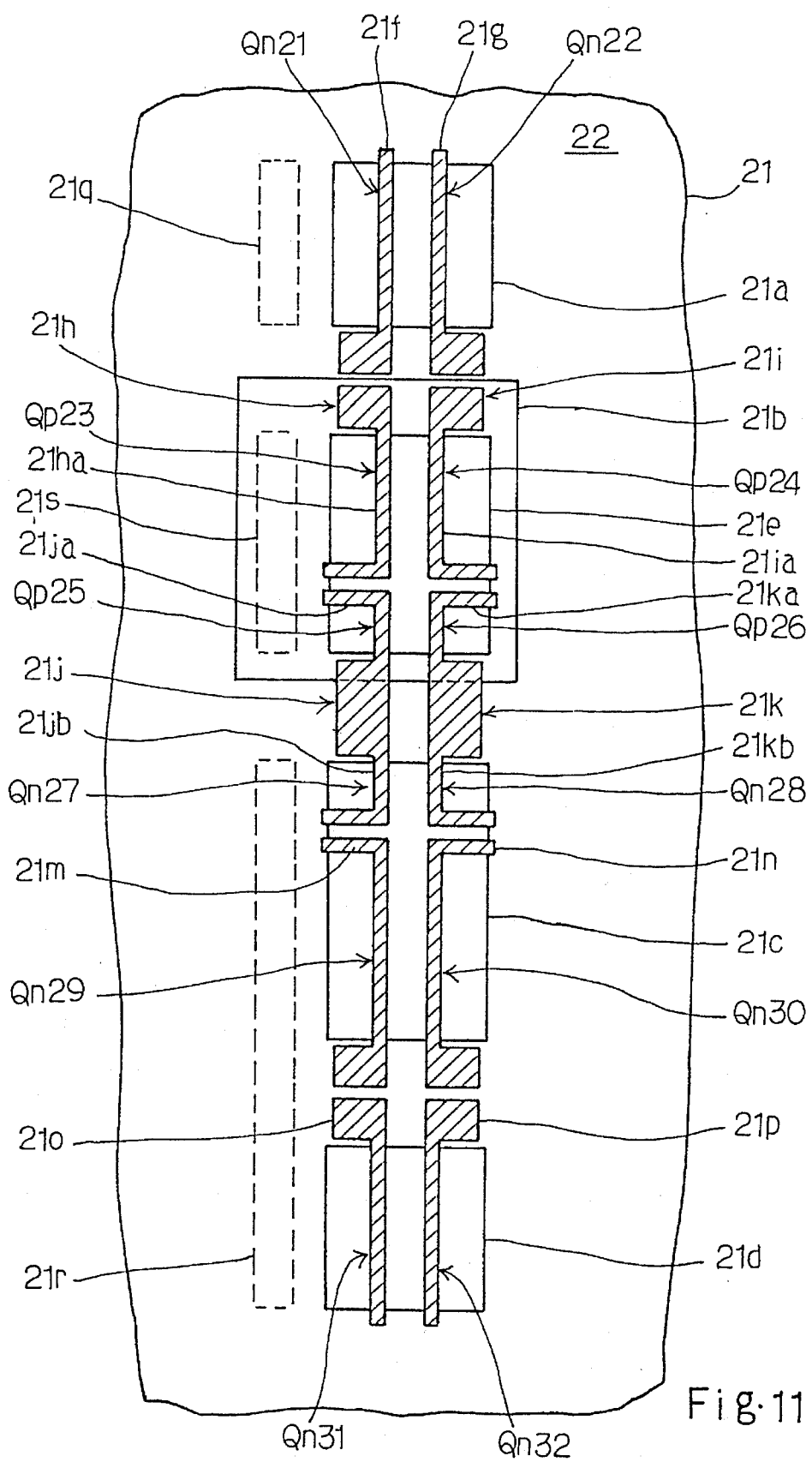
FIG. 11 is a plan view showing the layout of a basic cell incorporated in a semicustom-made integrated circuit device according to the present invention.

Referring to FIG. 11 of the drawings, a basic cell of a p-type semiconductor semicustom-made integrated circuit device embodying the present invention is fabricated on a part of a semiconductor wafer 21. The basic cell forms a part of a gate array. Although the basic cell is covered with an inter-level insulating layer, the inter-level insulating layer and thin gate oxide layers are deleted from the structure shown in FIG. 11, and conductive strips serving as gate electrodes are hatched for clearly understanding the layout.

A thick field oxide layer 22 is selectively grown on the major surface of the semiconductor wafer 21 so as to define n-type source/drain regions 21a, an n-type well 21b, n-type source/drain regions 21c and n-type source/drain regions 21d, and a p-type source/drain regions 21e is formed in the n-type well 21b.

A pair of conductive strips 21f/21g extend over channel regions between the n-type source/drain regions 21a, and serves as gate electrodes (hereinbelow also labeled with reference sign 21f and 21g. The gate electrodes 21f and 21g and the n-type source/drain regions 21a form in combination a pair of large n-channel type field effect transistors Qn21/Qn22.

Another pair of conductive strips 21h/21i shares the p-type source/drain region 21e with yet another pair of conductive strips 21j/21k. Parts of the conductive strips 21h/21i serve as L-shaped gate electrodes 21ha and 21ia, respectively, and form a pair of large p-channel type field effect transistors Qp23/Qp24 together with the part of the n-type source/drain regions 21e. Parts of the conductive strips 21j/21k also serve as inverted L-shaped gate electrodes 21ja and 21ka, respectively, and the inverted L-shaped gate electrodes 21ja and 21ka and the remaining part of the n-type source/drain regions 21e form a pair of small p-channel type field effect transistors Qp25/Qp26. The short portions of the L-shaped gate electrodes 21ha/21ia are opposed to the short portions of the inverted L-shaped gate electrodes 21ja/21ka, and the pair of large p-channel type field effect transistors Qp23/Qp24 and the pair of small p-channel type field effect transistors Qp25/Qp26 are fabricated on the n-type source/drain regions 21e.

The pair of conductive strips 21j/21k is in turn shared between the remaining part of the p-type source/drain regions 21e and a part of the n-type source/drain regions 21c, and the remaining parts of the conductive strips serves as L-shaped gate electrodes 21jb/21kb, respectively, and the L-shaped gate electrodes 21jb/21kb and a part of the n-type source/drain regions 21c form a pair of small n-channel type field effect transistors Qn27/Qn28.

The remaining part of the n-type source/drain regions 21c is associated with a pair of conductive strips 21m/21n, and parts of the conductive strips 21m/21n serve as inverted L-shaped gate electrodes of a pair of large n-channel type field effect transistors Qn29 and Qn30. The short portions of the L-shaped gate electrodes 21jb/21kb are opposed to the short portions of the inverted L-shaped gate electrodes 21m and 21n, and the pair of small n-channel type field effect transistors Qn27/Qn28 and the pair of large n-channel type field effect transistors Qn29/Qn30 are fabricated over the n-type source/drain regions 21c.

A pair of conductive strips 21o and 21p extend over channel regions between the n-type source/drain regions 21d, and serve as gate electrodes of a pair of large n-channel type field effect transistors Qn31 and Qn32.

Contact holes 1m and 1n are provided beside the n-type source/drain regions 21a and the n-type source/drain regions 21c/21d for biasing the substrate, and the n-type well 21e is biased through a contact hole 21s.

The p-channel type field effect transistors Qp25 and Qp26 are smaller in channel width than the p-channel type field effect transistors Qp23 and Qp24, and the n-channel type field effect transistors Qn27 and Qn28 are smaller in channel width than the n-channel type field effect transistors Qn29 and Qn30. The total channel width of the n-channel type field effect transistors Qn27/Qn29 or the Qn28/Qn30 is larger than the channel width of each of the n-channel type field effect transistors Qn21, Qn22, Qn31 and Qn32.

In the above description, a "large" field effect transistor has a channel wider than a "small" field effect transistor, and the "large" field effect transistor is larger in gain than the "small" field effect transistor.

The large p-channel type field effect transistors Qp23/Qp24, the large n-channel type field effect transistors Qn29/Qn30, the small p-channel type field effect transistors Qp25/Qp26 and the small n-channel type field effect transistors Qn27/Qn28 are available for a fundamental logic gate. On the other hand, the small p-channel type field effect transistors Qp25/Qp26 are designed to form a flip-flop together with the small n-channel type field effect transistors Qn27/Qn28 and the large n-channel type field effect transistors Qn29/Qn30.

As will be understood from the layout shown in FIG. 11, the p-type source/drain regions 21e is shared between the large p-channel type field effect transistors Qp23/Qp24 and the small p-channel type field effect transistors Qp25/Qp26, and this feature results in reduction of the occupation area of the n-type well 21b.

Figure 9:
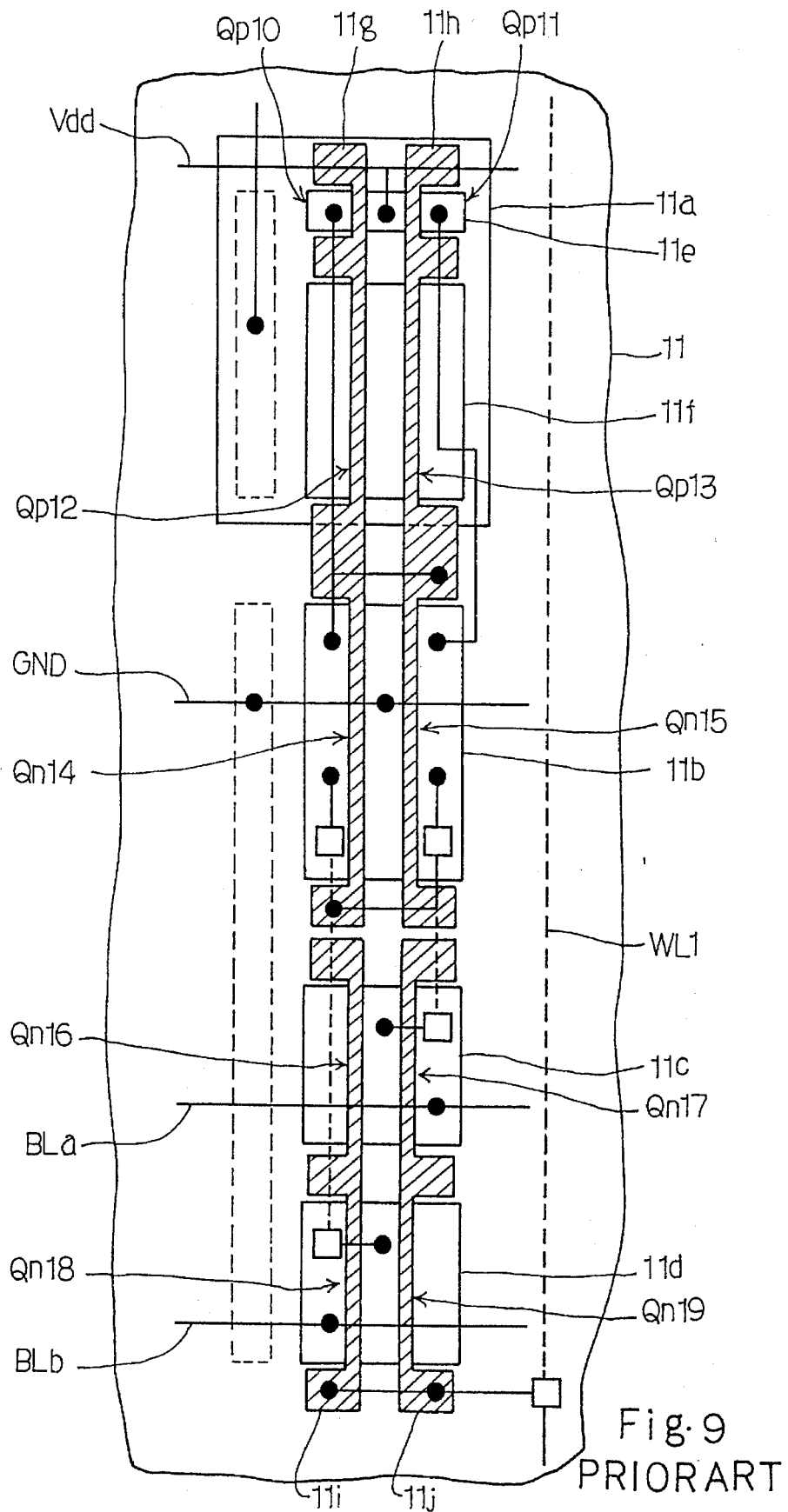
FIG. 9 is a plan view showing the layout of the prior art flip-flop type memory cell formed in the prior art basic cell.
Figure 10:
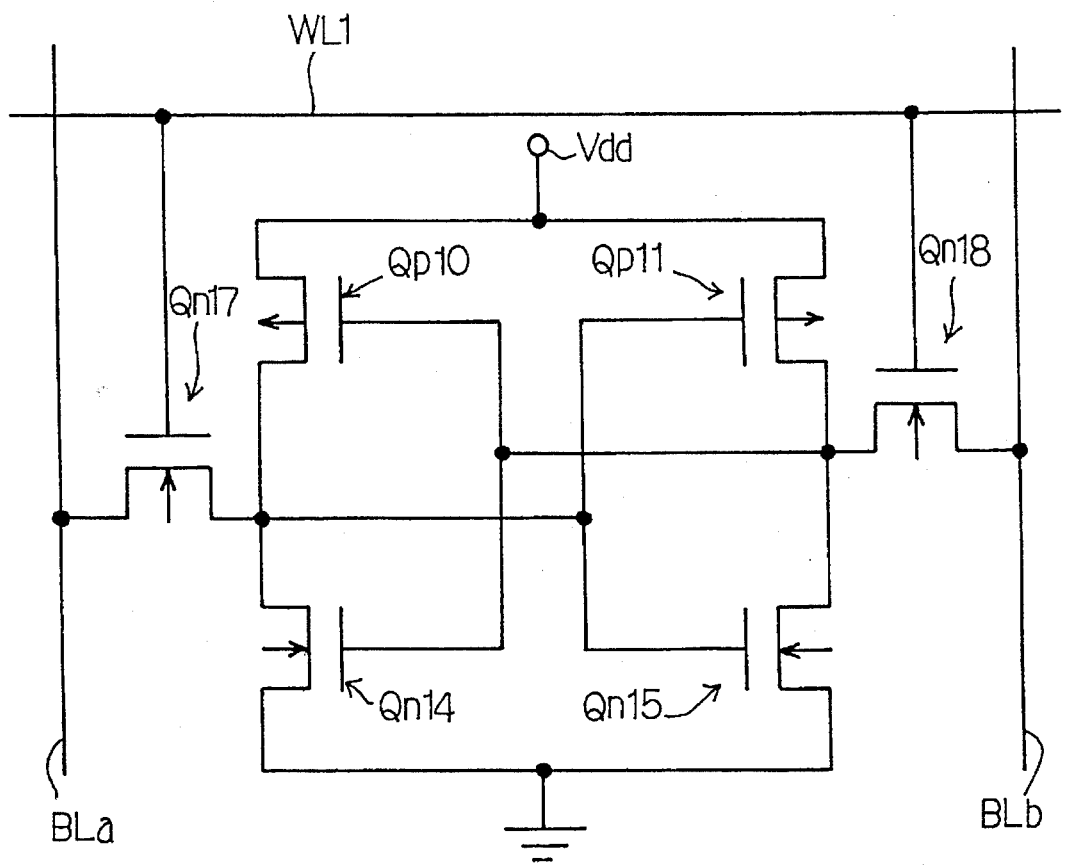
FIG. 10 is a circuit diagram showing the equivalent circuit of the prior art flip-flop type memory cell shown in FIG. 9.

In detail, the prior art basic cell shown in FIG. 9 requires the p-type source/drain regions 11e spaced from the p-type source/drain regions 11f, and a separation area is indispensable between the p-type source/drain regions 11e and the p-type source/drain regions 11f. However, the n-type source/drain regions 21e does not require a separation region, and the gate electrodes 21h/21i separated from the gate electrodes 21ja/21ka allow the manufacturer to selectively use the large p-channel type field effect transistors Qp23/Qp24 and the small p-channel type field effect transistors Qp25/Qp26. Thus, the narrow p-type source/drain regions 21e make the n-type well 21b smaller, and the occupation area of the basic cell is narrower than the occupation area of the prior art basic cell.

Figure 13:
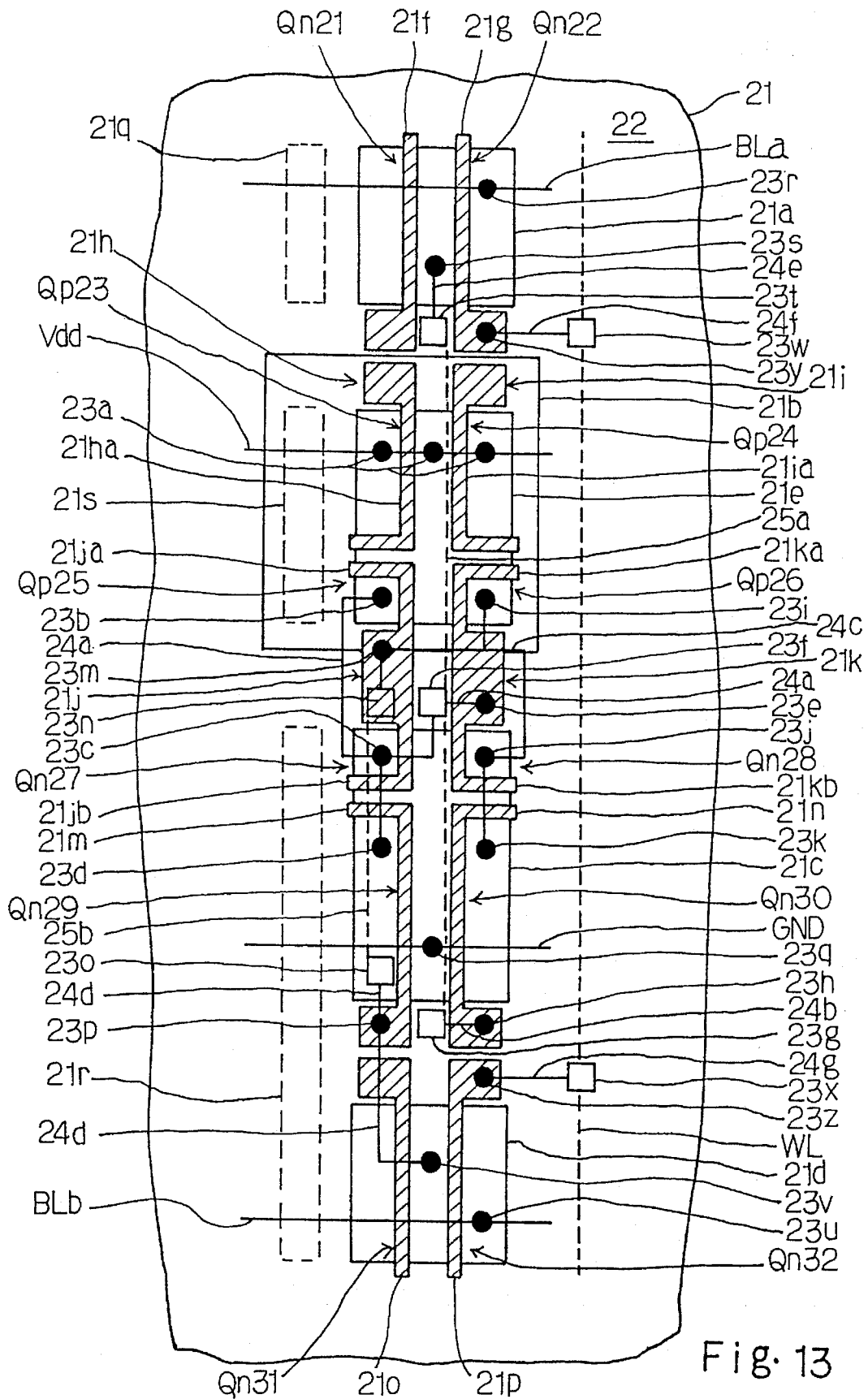
FIG. 13 is a plan view showing a wiring arrangement over the basic cell for forming a flip-flop type memory cell.
Figure 14:
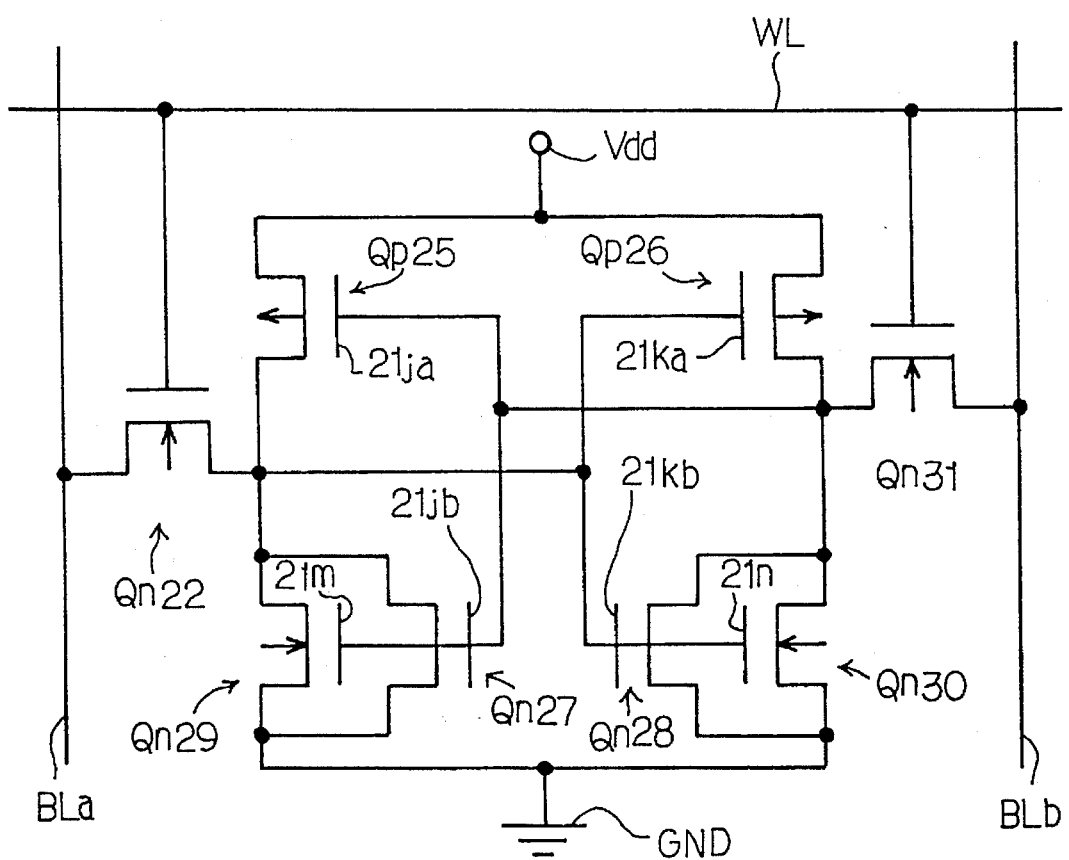
FIG. 14 is a circuit diagram showing an equivalent circuit of the flip-flop type memory cell.

FIG. 13 illustrates a wiring arrangement over the basic cell, and the wiring arrangement forms a flip-flop type memory cell together with the field effect transistors Qn21 to Qn32. Real lines represents first-level wirings, and broken lines stand for second-level wirings. Dots and boxes are contact holes.

A positive power voltage line Vdd is connected through source contact holed 23a to the p-type source/drain regions 21e, and the large p-channel type field effect transistors Qp23 and Qp24 are disabled without a wiring to the gate electrodes 21ha and 21ia. The positive power voltage is supplied to a p-type common source region of the small p-channel type field effect transistors Qp25 and Qp26.

A first-level wiring 24a connects the p-type drain region of the small p-channel type field effect transistor Qp25 through drain contact holes 23b, 23c and 23d to the n-type drain regions of the small/large n-channel type field effect transistors Qn27/Qn29. The first-level wiring 24a is in turn connected through a gate contact hole 23e to the conductive strip 21k, and is connected through an inter-level contact hole 23f to a second-level wiring 25a. The second-level wiring 25a is connected through an inter-level contact hole 23g, a first-level wiring 24b and a gate contact hole 23h to the conductive strip 21n. Thus, the drain region of the small p-channel type field effect transistor Qp25 is electrically connected to not only the drain nodes of the small/large n-channel type field effect transistors Qn27/Qn29 but also to the gate electrode 21ka of the small p-channel type field effect transistor Qp26 and the gate electrodes 21kb/21n of the small/large n-channel type field effect transistors Qn28 and Qn30.

Similarly, a first-level wiring 24c connects the p-type drain region of the small p-channel type field effect transistor Qp26 through drain contact holes 23i, 23j and 23k to the n-type drain regions of the small/large n-channel type field effect transistors Qn28/Qn30. The first-level wiring 24c is in turn connected through a gate contact hole 23m to the conductive strip 21j, and is connected through an inter-level contact hole 23n to a second-level wiring 25b. The second-level wiring 25b is connected through an inter-level contact hole 23o, a first-level wiring 24d and a gate contact hole 23p to the conductive strip 21m. Thus, the drain region of the small p-channel type field effect transistor Qp26 is electrically connected to not only the n-type drain regions of the small/large n-channel type field effect transistors Qn28/Qn30 but also to the gate electrode 21ja of the small p-channel type field effect transistor Qp25 and the gate electrodes 21jb/21m of the small/large n-channel type field effect transistors Qn27 and Qn29.

The n-type common source region of the small/large n-channel type field effect transistors Qn27/Qn28 and Qn29/Qn30 is connected through a source contact hole 23q to a ground voltage line GND. Thus, complementary inverters formed by the field effect transistors Qp25/Qn27/Qn29 and Qp26/Qn28/Qn30 are coupled in parallel between the positive power voltage line Vdd and the ground voltage line GND.

A pair of bit lines BLa and BLb is associated with the flip-flop type memory cell. The bit line BLa is connected through a source/drain contact hole 23r to the n-type source/drain region of the large n-channel type field effect transistor Qn22, and the other n-type source/drain region of the n-channel type field effect transistor Qn22 is connected through a source/drain contact hole 23s to a first-level wiring 24e. The first-level wiring 24e is connected through an inter-level contact hole 23t to the second-level wiring 25a. For this reason, the bit line BLa is electrically connectable to the other n-type source/drain region of the large n-channel type field effect transistor Qn22, and the other n-type source/drain region of the large n-channel type field effect transistor Qn22 is electrically connected through the second-level wiring 25a and the first-level wirings 24a/24b to the gate electrode 21ka of the small p-channel type field effect transistor Qp26, the gate electrodes 21kb/21n of the small/large n-channel type field effect transistors Qn28/Qn30 and the n-type drain regions of the small/large n-channel type field effect transistors Qn27/Qn29.

On the other hand, the bit line BLb is connected through a source/drain contact hole 23u to the n-type source/drain region of the large n-channel type field effect transistor Qn32, and the other n-type source/drain region of the n-channel type field effect transistor Qn32 is connected through a source/drain contact hole 23v to the first-level wiring 24d. Thus, the bit line BLb is electrically connectable to the other source/drain region of the large n-channel type field effect transistor Qn32, and the other source/drain region is electrically connected through the first-level wiring 24d, the second-level wiring 25b and the first-level wiring 24c to the gate electrode 21ja of the small p-channel type field effect transistor Qp25, the gate electrodes 21jb/21m of the small/large n-channel type field effect transistors Qn27/Qn29 and the drain regions of the small/large n-channel type field effect transistors Qn28/Qn30.

A word line WL extends on a second level, and is connected through inter-level contact holes 23w/23x to first-level wirings 24f/24g, and the first-level wirings 24f/24g are connected through gate contact holes 23y/23z to the gate electrodes 21g and 21p. Thus, the large n-channel type field effect transistors Qn22 and Qn32 are concurrently gated by the word line WL.

The flip-flop type memory cell is equipped with the small p-channel type field effect transistors Qp25 and Qp26, and the small p-channel type field effect transistors Qp25 and Qp26 improve the write-in characteristics and the access speed. Moreover, the channel width of the large n-channel type field effect transistors Qn22 and Qn32 is smaller than the total channel width of the small/large n-channel type field effect transistors Qn27/Qn29 or Qn28/Qn30. The parallel combination of the small/large n-channel type field effect transistors Qn27/Qn29 or Qn28/Qn30 is designed to be suitable for a discharging path of the flip-flop type memory cell. For this reason, the n-large channel type field effect transistors Qn22 and Qn32 are relatively small in channel width in the flip-flop type memory cell, and the small parasitic capacitance improves the switching speed and, accordingly, the access speed.

A data bit is represented by a potential difference, and is written into and read out from the flip-flop type memory cell as follows.

When the data bit is supplied to the pair of bit lines BLa/BLb, the potential difference takes place between the bit lines BLa and BLb. Firstly, the potential level on the bit line BLa is assumed to be higher than the potential level on the other bit line BLb.

The word line WL is changed to an active high level, and the large n-channel type field effect transistors Qn22 and Qn32 concurrently turn on so as to transfer the potential difference on the bit line pair BLa/BLb to the gate electrodes 21ka, 21kb and 21n and the gate electrodes 21ja, 21jb and 21m. Then, the small p-channel type field effect transistor Qp25 turns on, and the other small p-channel type field effect transistor Qp26 turns off. On the other hand, the small/large n-channel type field effect transistors Qn28 and Qn30 turn on, and the other small/large n-channel type field effect transistors Qn27 and Qn29 turn off. The small p-channel type field effect transistor Qp25 supplies the high potential level to the gate electrodes 21ka, 21kb and 21n, and the small/large n-channel type field effect transistors Qn28 and Qn30 supply the low potential level to the gate electrodes 21ja, 21jb and 21m. The high potential level and the low potential level maintain the potential difference transferred from the bit line pair BLa/BLb, and the status of the field effect transistors Qp25/Qp26, Qn27/Qn28 and Qn29/Qn30 is not changed after a recovery of the word line WL. Thus, the potential difference indicating the data bit is stored in the flip-flop type memory cell.

If the data bit is represented by the high potential level on the bit line BLb and the low potential level on the bit line BLa, the small p-channel type field effect transistor Qp26 and the small/large n-channel type field effect transistors Qn27/Qn29 turn on, and supply the high potential level and the low potential level to the gate electrodes 21ja/21jb/21m and the gate electrodes 21ka/21kb/21m, respectively. The status of the field effect transistors Qp25/Qp26, Qn27/Qn28 and Qn29/Qn30 is maintained after the recovery of the word line WL to the inactive low level, and the data bit represented by the opposite potential levels is stored in the flip-flop type memory cell.

The current supplied through the p-channel type field effect transistor Qp25 or Qp26 is so small that the potential difference is rapidly transferred to the gate electrodes 21ja/21jb/21m and 21ka/21kb/21n.

The data bit is read out from the flip-flop type memory cell to the bit line pair BLa and BLb as follows. When the word line WL is changed to the active high level, the n-channel type field effect transistors Qn22 and Qn32 turn on, and the potential difference between the gate electrodes 21ja/21jb/21m and the gate electrodes 21ka/21kb/21n is transferred through the n-channel type field effect transistors Qn32 and Qn22 to the bit lines BLa and BLb. Although the current charge and the current discharge are carried out through the n-channel type field effect transistors Qn22 and Qn32, the large n-channel type field effect transistors Qn22/Qn32 are not larger in the equivalent channel width than the small/large n-channel type field effect transistors Qn27/Qn29 and Qn28/Qn30, and the potential difference rapidly takes place between the bit lines BLa and BLb.

Figure 12:
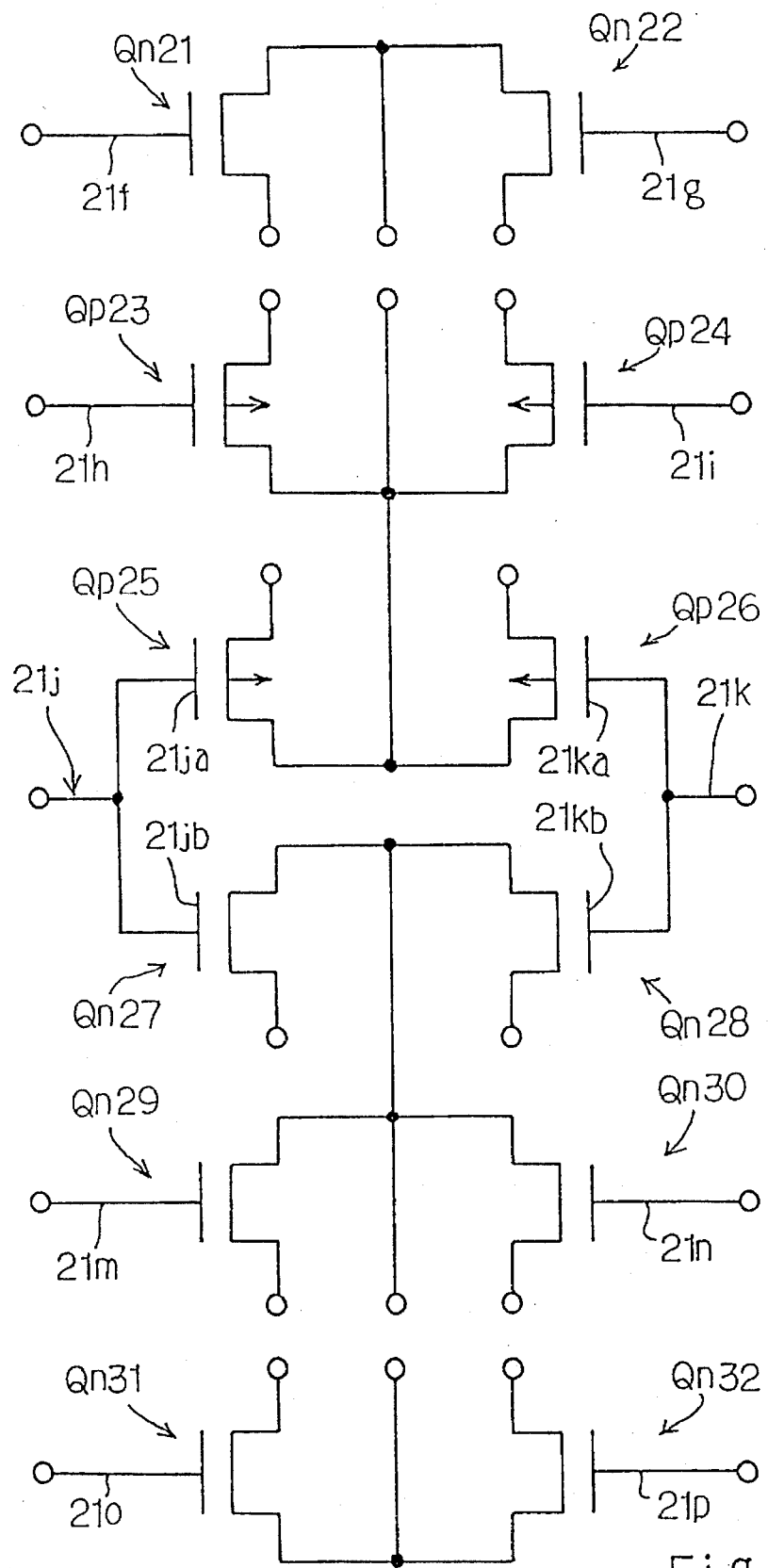
FIG. 12 is a circuit diagram showing an equivalent circuit of the basic cell shown in FIG. 11.

The basic cell show in FIGS. 11 and 12 is available for a logic gate. As described hereinbefore, the gate electrodes 21jb/21kb and the drain regions of the small n-channel type field effect transistors Qn27 and Qn28 are electrically connected to the gate electrodes 21m/21n and the drain regions of the large n-channel type field effect transistors Qn29 and Qn30 in the flip-flop type memory cell. When the logic gate is formed, the gate electrodes 21ja/21ka and the drain regions of the small p-channel type field effect transistors Qp25 and Qp26 are electrically connected to the gate electrodes 21h/21i and the drain regions of the large p-channel type field effect transistors Qp23 and Qp24 as similar to the small/large n-channel type field effect transistors Qn27/Qn28/Qn29/Qn30. Thus, the small/large p-channel type field effect transistors Qp23/Qp25 and Qp24/Qp26 serve as two composite p-channel type field effect transistors, and the small/large n-channel type field effect transistors Qn27/Qn29 and Qn28/Qn30 form two composite n-channel type field effect transistors.

The L-shaped gate electrodes 21ha, 21ia and the inverted L-shaped gate electrodes 21ja and 21ka are equivalent to wider straight gate electrodes, and the current driving capability is increased without an additional occupation area.

Figure 1:
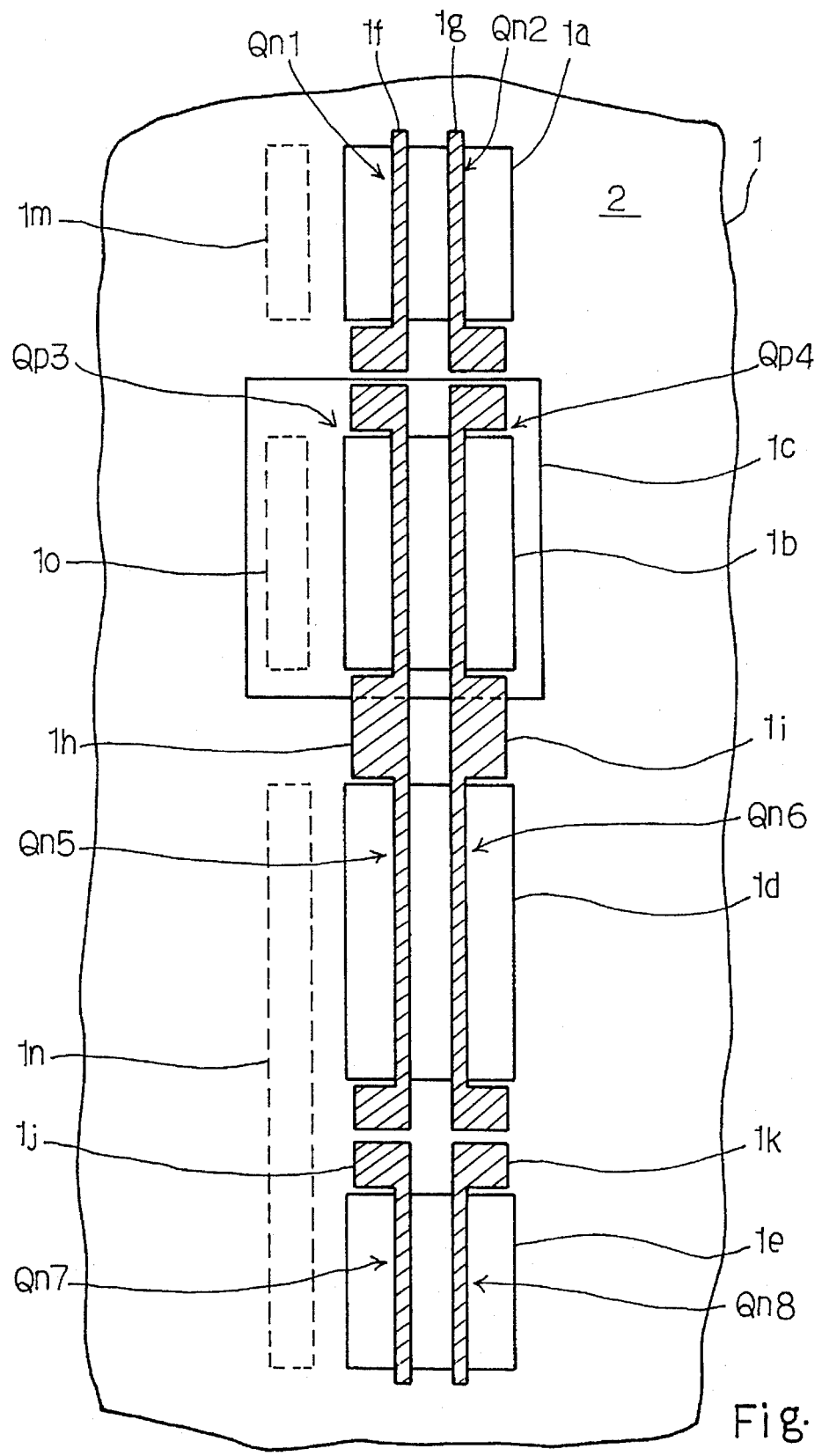
FIG. 1 is a plan view showing the layout of the part of the prior art gate array.
Figure 2:
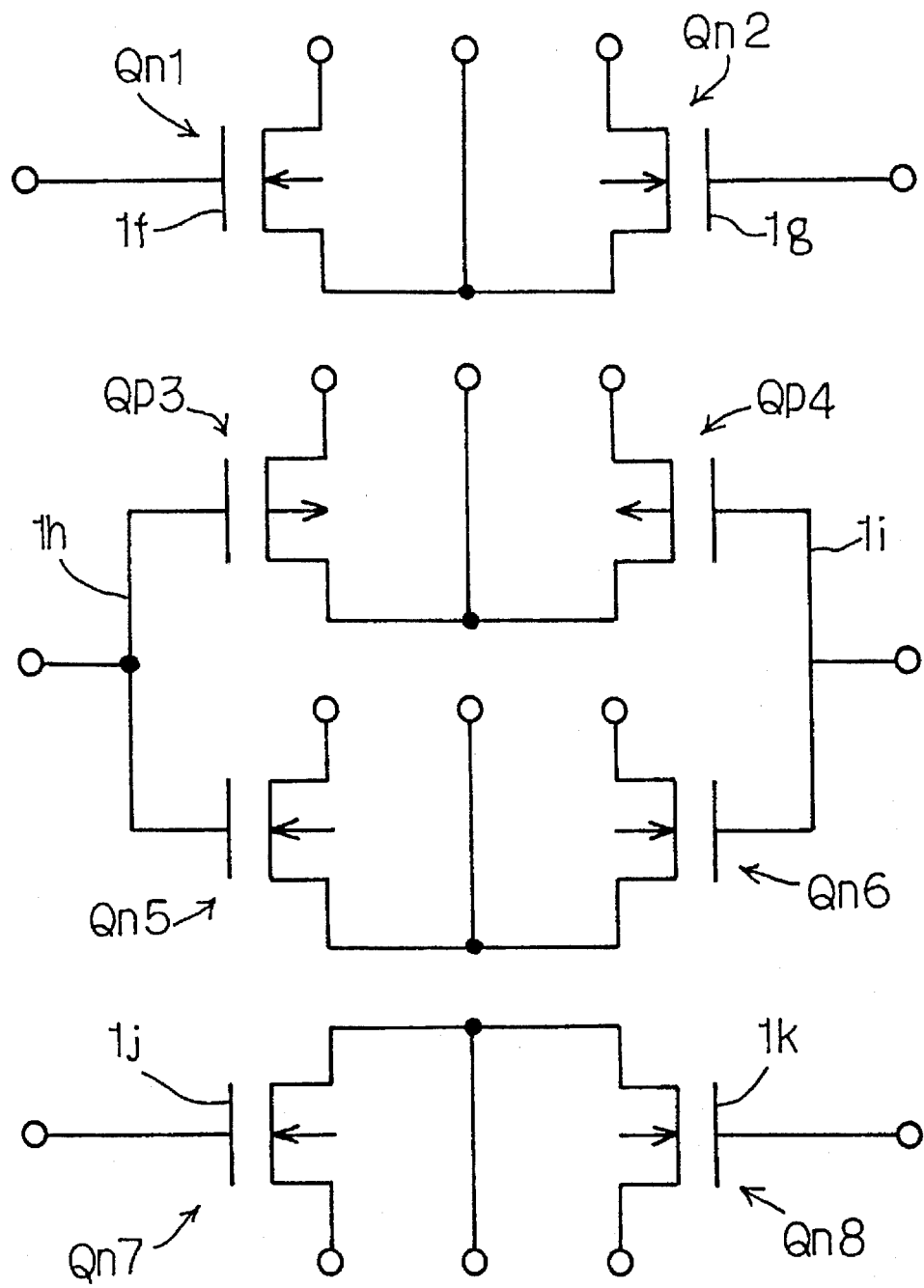
FIG. 2 is a circuit diagram showing the equivalent circuit of the part of the prior art gate array.
Figure 3:
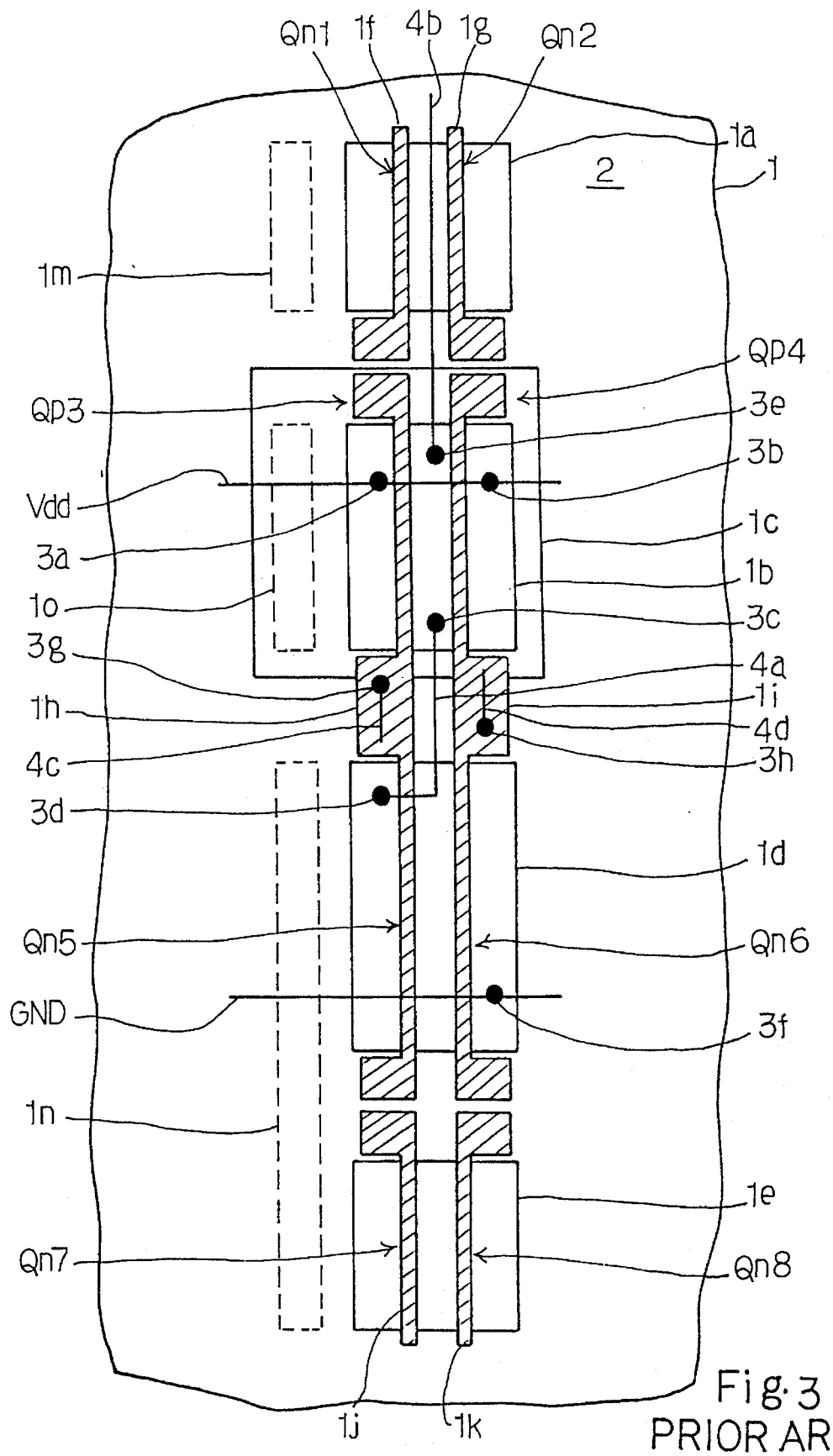
FIG. 3 is a plan view showing the wiring arrangement over the part of the prior art gate array for forming the two-input NAND gate.
Figure 4:
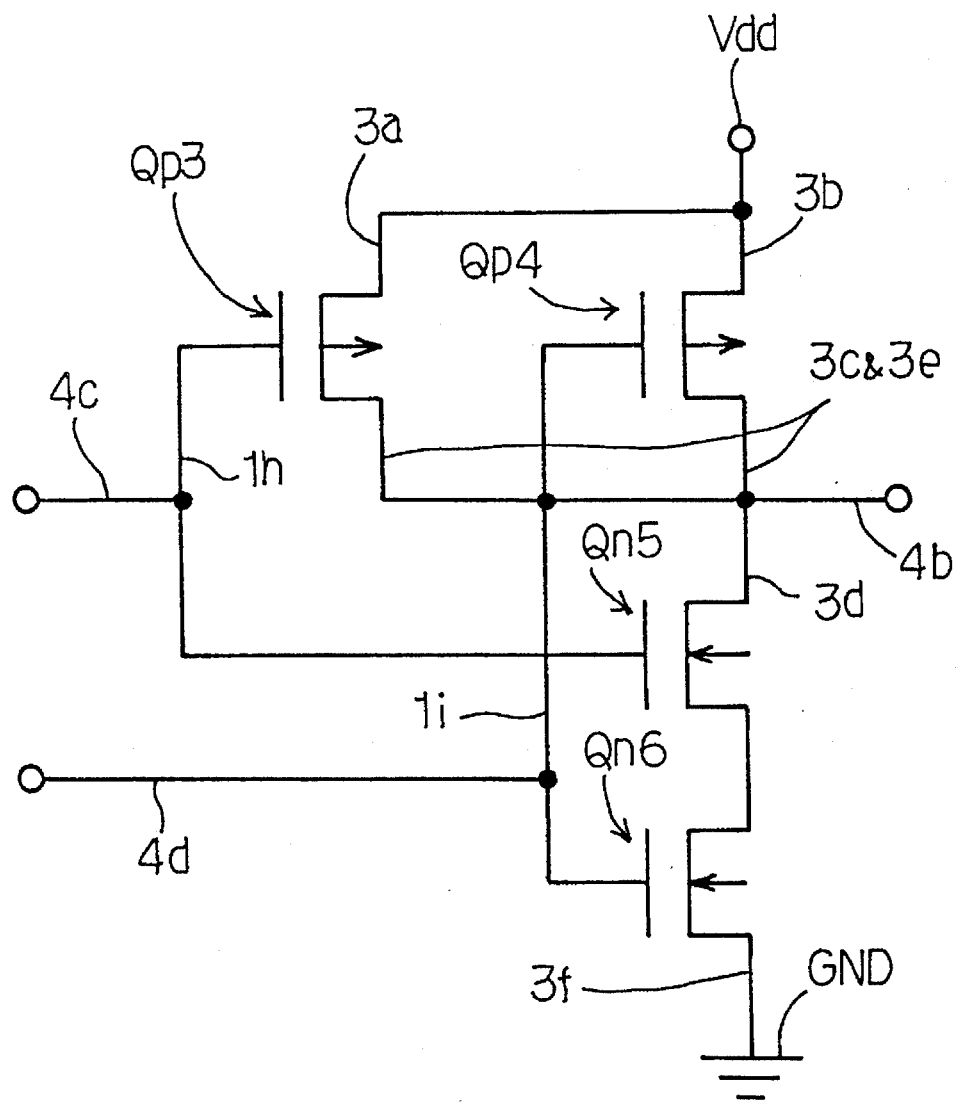
FIG. 4 is a circuit diagram showing the equivalent circuit of the two-input NAND gate.
Figure 5:
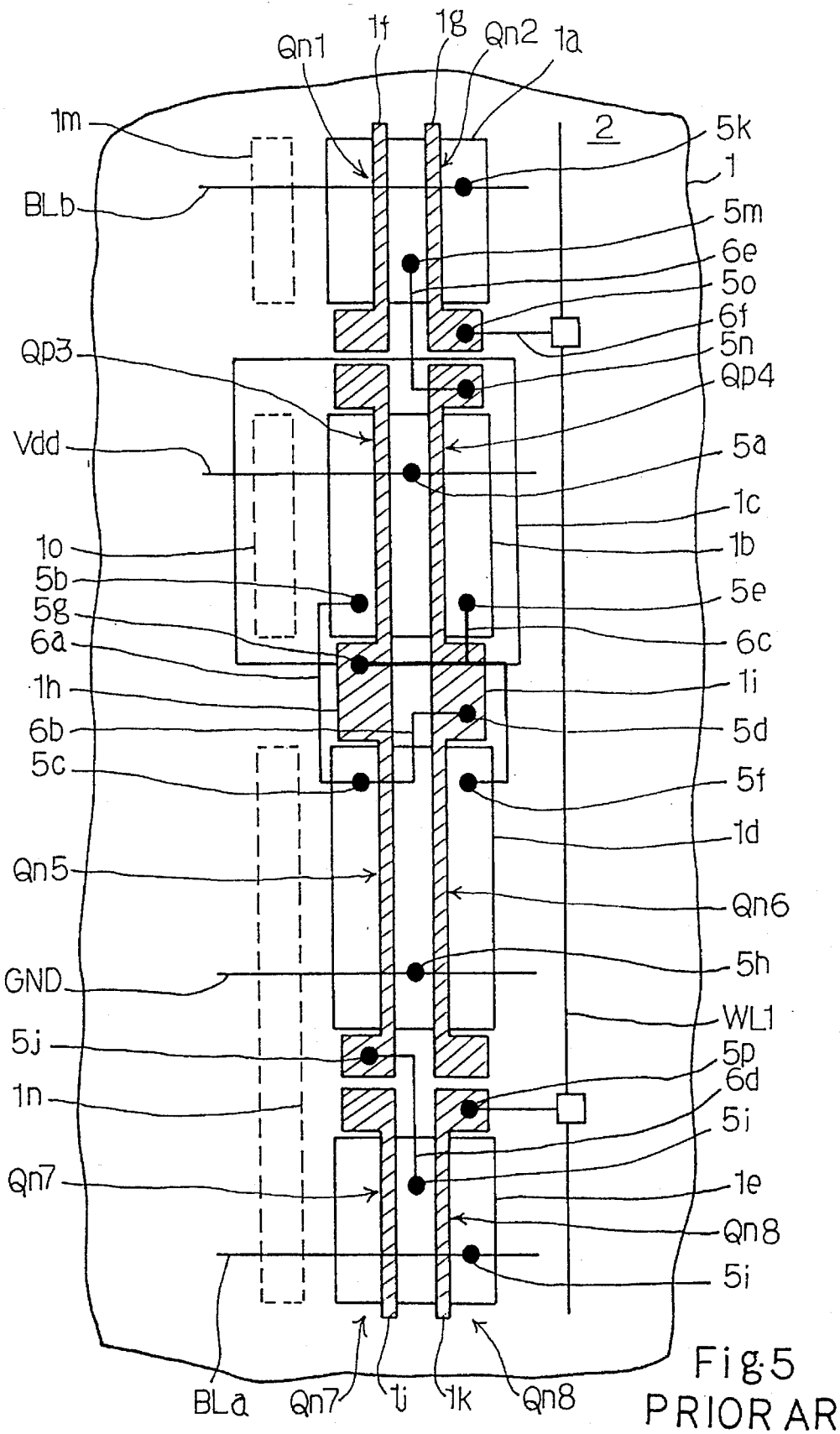
FIG. 5 is a plan view showing the wiring arrangement over the part of the prior art gate array for forming the flip-flop type memory cell.
Figure 6:
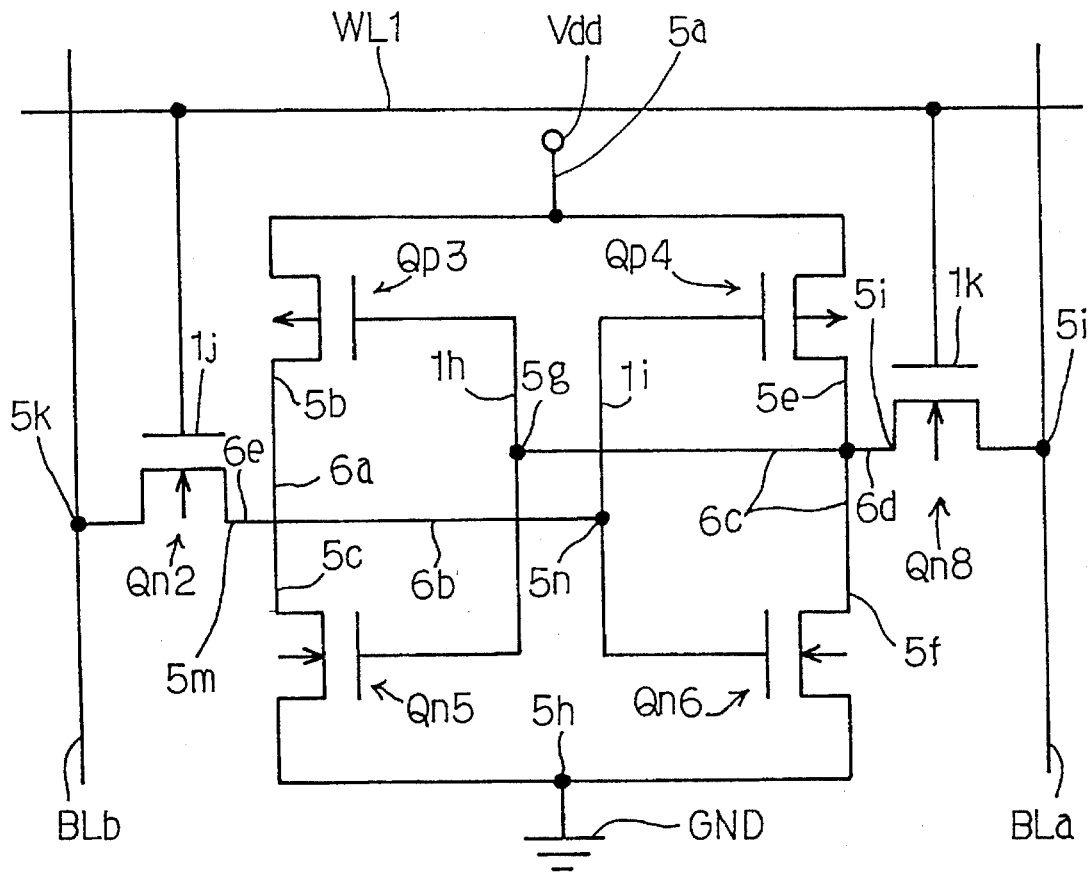
FIG. 6 is a circuit diagram showing the arrangement of the flip-flop type memory cell.
Figure 7:
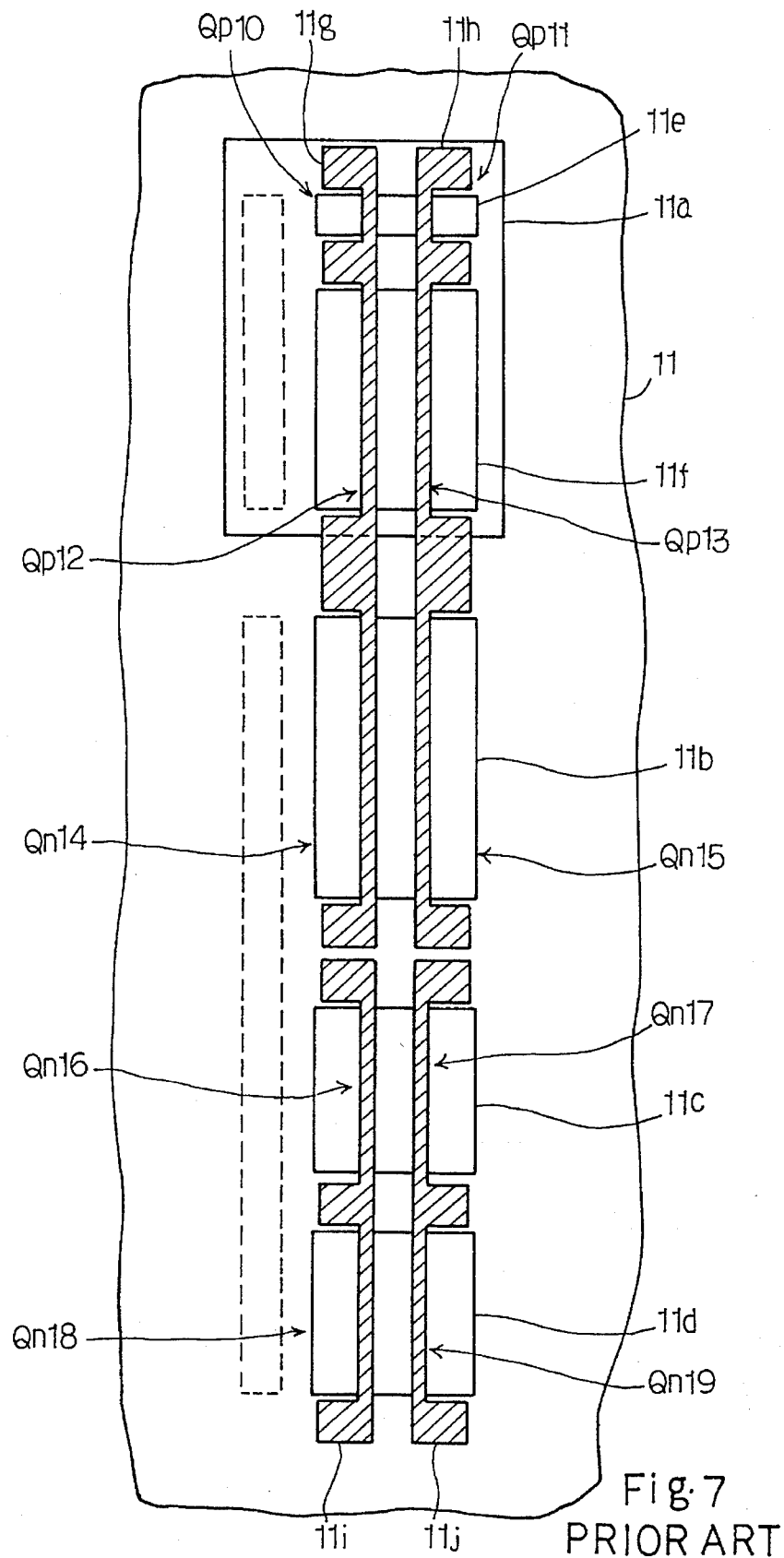
FIG. 7 is a plan view showing the layout of the prior art basic cell disclosed in Japanese Patent Publication of Unexamined Application No. 4-99064.
Figure 8:
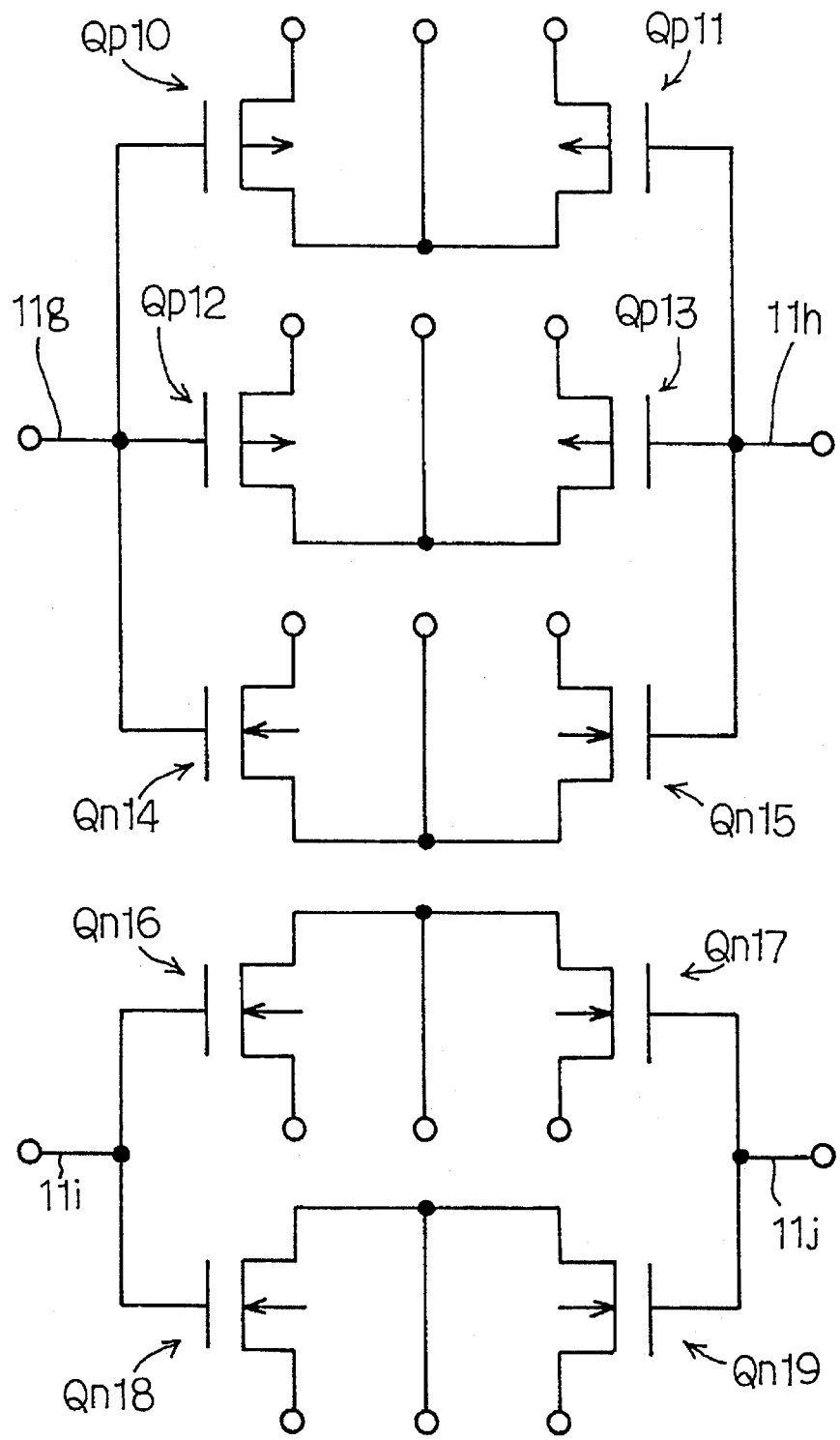
FIG. 8 is a circuit diagram showing the equivalent circuit of the prior art basic cell shown in FIG. 7.

If the logic gate is the NAND, the two composite p-channel type field effect transistors Qp23/Qp25 and Qp24/Qp26 and the two composite n-channel type field effect transistors Qn27/Qn29 and Qn28/Qn30 are connected as shown in FIGS. 3 and 4.

Second Embodiment

Figure 15:
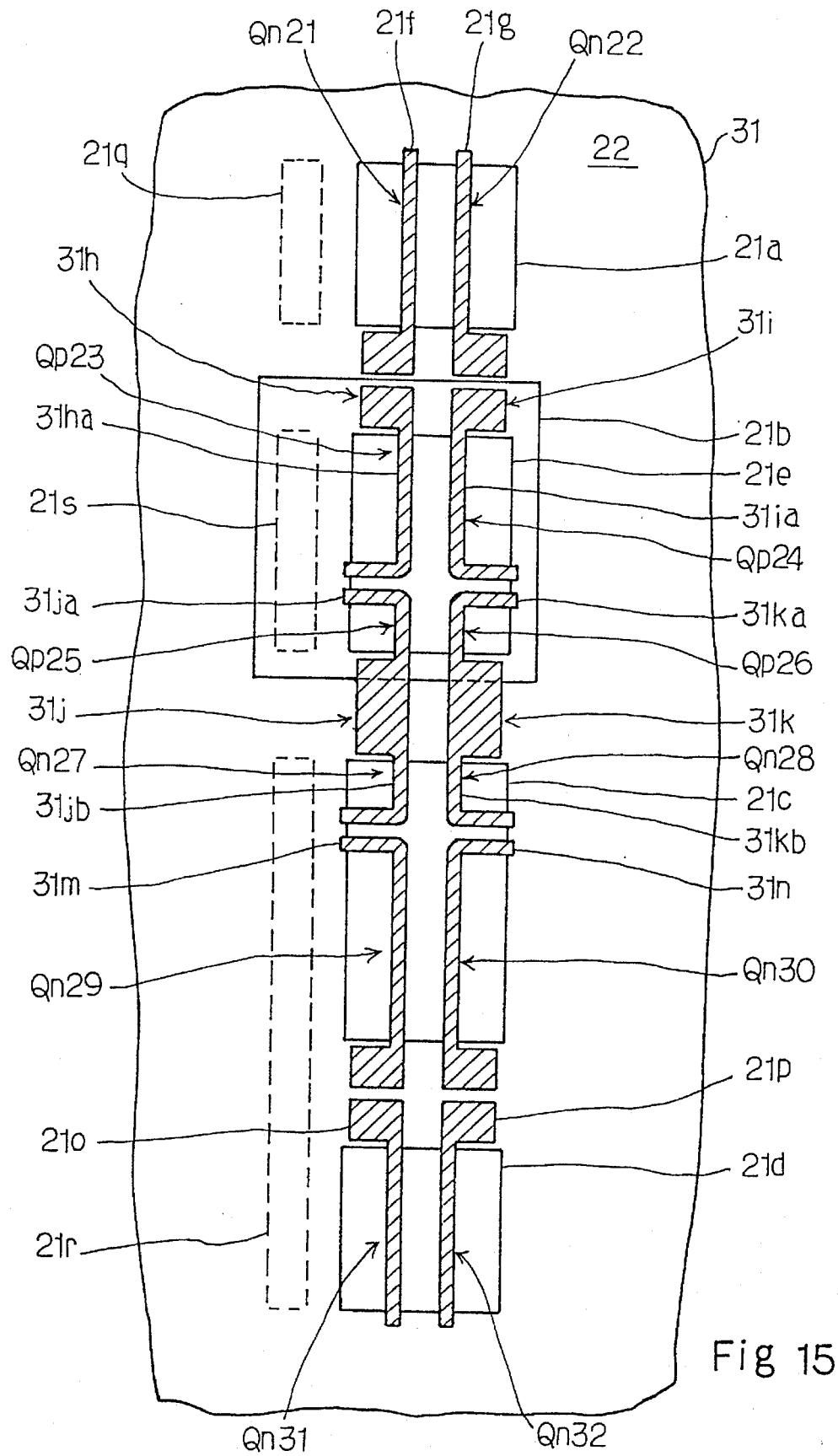
FIG. 15 is a plan view showing a layout of another basic cell according to the present invention.

Turning to FIG. 15, a basic cell of another gate array is fabricated on a part of a p-type semiconductor wafer 31 serving as a substrate. Although the basic cell is covered with an inter-level insulating layer, the inter-level insulating layer and thin gate oxide layers are deleted from the structure shown in FIG. 11, and conductive strips serving as gate electrodes are hatched for clearly understanding the layout.

The basic cell of the second embodiment is different from the basic cell of the first embodiment in configuration of gate electrodes. However, the basic layout is similar to that of the first embodiment, and, for this reason, a well and impurity regions are labeled with the same references designating counter portions of the first embodiment without detailed description. The equivalent circuit of the second embodiment is identical with that of the first embodiment shown in FIG. 12.

The field effect transistors Qn21, Qn22, Qn31 and Qn32 of the first embodiment have respective gate electrodes 21f to 21p sharply bent at right angle; however, the gate electrodes 31ha, 31ia, 31ja, 31ka, 31jb, 31kb, 31m and 31n of the field effect transistors Qp23, Qp24, Qp25, Qp26, Qn27, Qn28, Qn29 and Qn30 have respective mild or curved corners. The curved gate electrodes 31ha to 31m are longer than the sharp gate electrodes 21h to 21m, and increase the gains of the field effect transistors Qp23 to Qn30.

The p-channel type field effect transistors Qp23 and Qp24 are larger in channel width and, accordingly, gain than the p-channel type field effect transistors Qp25 and Qp26, and share the n-type well 21b with the p-channel type field effect transistors Qp25 and Qp26. The p-channel type field effect transistors Qp23, Qp24, Qp25 and Qp26 and the n-channel type field effect transistors Qn27, Qn28, Qn29 and Qn30 form a logic gate, and the channel width of the p-channel type field effect transistors Qp25 and Qp26 is designed to form a flip-flop circuit together with the small and large n-channel type field effect transistors Qn27 to Qn32.

The p-type source/drain regions 21e and the n-type source/drain regions 21c are shared between the large p-channel type field effect transistors Qp23/Qp24 and the small p-channel type field effect transistors Qp25/Qp26 and between the small n-channel type field effect transistors Qn27/Qn28 and the large n-channel type field effect transistors Qn29/Qn30, respectively, and occupy smaller areas than those of the prior art.

Figure 16:
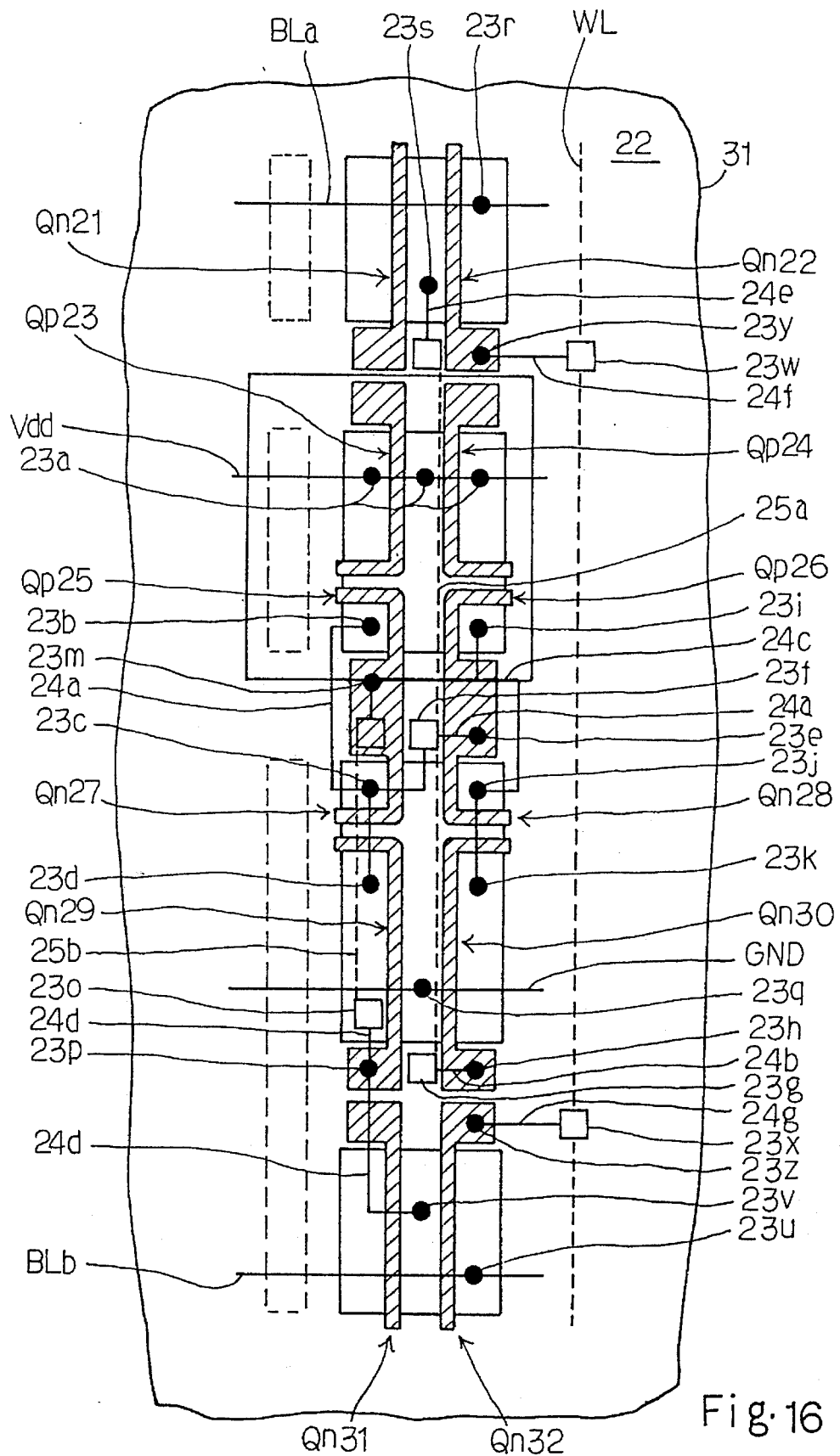
FIG. 16 is a circuit diagram showing an equivalent circuit of the cell shown in FIG. 15.

FIG. 16 illustrates a wiring arrangement over the basic cell shown in FIG. 15, and the basic cell and the wiring arrangement realizes a flip-flop type memory cell. The wiring arrangement is similar to the wiring arrangement over the basic cell shown in FIG. 13, and wiring corresponding to those of the first embodiment are designated by the same reference signs without detailed description.

The p-channel type field effect transistors Qp25 and Qp26 are smaller in channel width than the p-channel type field effect transistors Qp23 and Qp24, and the n-channel type field effect transistors Qn27 and Qn28 are smaller in channel width than the n-channel type field effect transistors Qn29 and Qn30. The total channel width of the n-channel type field effect transistors Qn27/Qn29 or the Qn28/Qn30 is larger than the channel width of each of the n-channel type field effect transistors Qn21, Qn22, Qn31 and Qn32.

The flip-flop type memory cell is broken down into two complementary inverters and two large n-channel type field effect transistors Qn22 and Qn31, and the small p-channel type field effect transistor Qp25/Qp26 is coupled in series to the parallel combination of the small/large n-channel type field effect transistors Qn27/Qn29 or Qn28/Qn30 for forming the complementary inverter. The small p-channel type field effect transistors Qp25 and Qp26 are smaller in gain or current driving capability than the parallel combination of the small/large n-channel type field effect transistors Qn27/Qn29 or Qn28/Qn30, and, for this reason, the flip-flop type memory cell is enhanced in operation margin.

Moreover, the channel width of the large n-channel type field effect transistors Qn22 and Qn32 is smaller than the total channel width of the small/large n-channel type field effect transistors Qn27/Qn29 or Qn28/Qn30. The parallel combination of the small/large n-channel type field effect transistors Qn27/Qn29 or Qn28/Qn30 is designed to be suitable for a discharging path of the flip-flop type memory cell. For this reason, the n-channel type field effect transistors Qn22 and Qn32 are relatively small in channel width in the flip-flop type memory cell, and the small parasitic capacitance improves the switching speed and, accordingly, the access speed.

A data bit represented by a potential difference is written into and read out from the flip-flop type memory cell as follows. When the data bit is supplied to the pair of bit lines BLa/BLb, the potential difference takes place between the bit lines BLa and BLb. Firstly, the potential level on the bit line BLa is assumed to be higher than the potential level on the other bit line BLb.

The word line WL is changed to an active high level, and the n-channel type field effect transistors Qn22 and Qn32 concurrently turn on so as to transfer the potential difference on the bit line pair BLa/BLb to the gate electrodes 31ka, 31kb and 31n and the gate electrodes 31ja, 31jb and 31m. Then, the small p-channel type field effect transistor Qp25 turns on, and the other small p-channel type field effect transistor Qp26 turns off. On the other hand, the n-channel type field effect transistors Qn28 and Qn30 turn on, and the other n-channel type field effect transistors Qn27 and Qn29 turn off. The small p-channel type field effect transistor Qp25 supplies the high potential level to the gate electrodes 31ka, 31kb and 31n, and the n-channel type field effect transistors Qn28 and Qn30 supply the low potential level to the gate electrodes 31ja, 31jb and 31m. The high potential level and the low potential level maintain the potential difference transferred from the bit line pair BLa/BLb, and the status of the field effect transistors Qp25/Qp26, Qn27/Qn28 and Qn29/Qn30 is not changed after a recovery of the word line WL. Thus, the potential difference indicating the data bit is stored in the flip-flop type memory cell.

If the data bit is represented by the high potential level on the bit line BLb and the low potential level on the bit line BLa, the small p-channel type field effect transistor Qp26 and the n-channel type field effect transistors Qn27/Qn29 turn on, and supply the high potential level and the low potential level to the gate electrodes 31ja/31jb/31m and the gate electrodes 31ka/31kb/31m, respectively. The status of the field effect transistors Qp25/Qp26, Qn27/Qn28 and Qn29/Qn30 is maintained after the recovery of the word line WL to the inactive low level, and the data bit represented by the opposite potential levels is stored in the flip-flop type memory cell.

The current supplied through the p-channel type field effect transistor Qp25 or Qp26 is so small that the potential difference is rapidly transferred to the gate electrodes 31ja/31jb/31m and 31ka/31kb/31n.

The data bit is read out from the flip-flop type memory cell to the bit line pair BLa and BLb as follows. When the word line WL is changed to the active high level, the n-channel type field effect transistors Qn22 and Qn31 turn on, and the potential difference between the gate electrodes 31ja/31jb/31m and the gate electrodes 31ka/31kb/31n is transferred through the n-channel type field effect transistors Qn31 and Qn22 to the bit lines BLa and BLb. Although the current charge and the current discharge are carried out through the n-channel type field effect transistors Qn22 and Qn31, the n-channel type field effect transistors Qn22/Qn31 are not larger in the equivalent channel width than the n-channel type field effect transistors Qn27/Qn29 and Qn28/Qn30, and the potential difference rapidly takes place between the bit lines BLa and BLb.

The wiring arrangement for the logic gate is similar to that of the first embodiment, and the logic gate is improved in switching speed by virtue of the curved gate electrodes 31ha to 31n.

Third Embodiment

Figure 17:
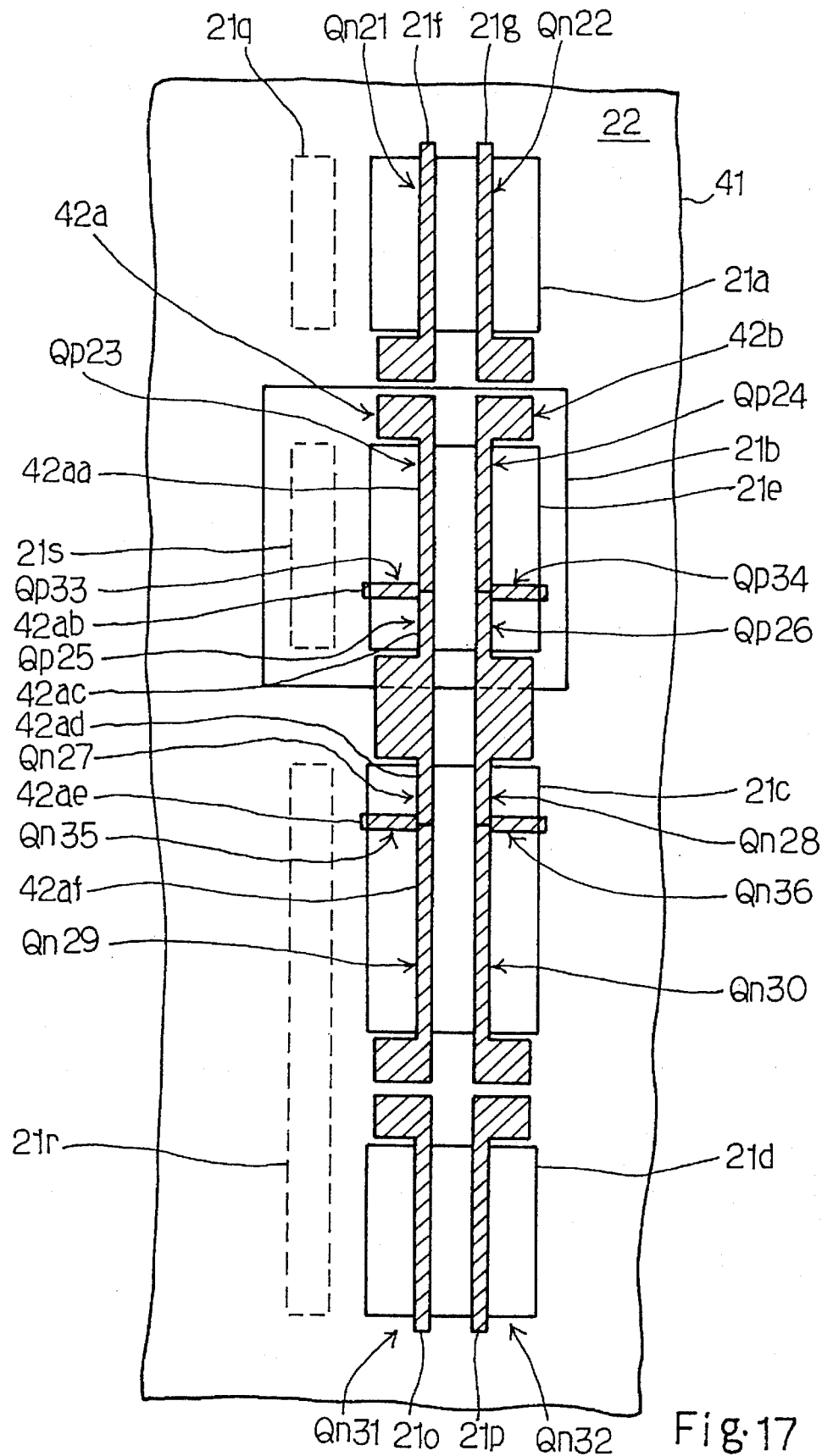
FIG. 17 is a plan view showing a layout of yet another basic cell according to the present invention.

Turning to FIG. 17 of the drawings, a basic cell of yet another gate array is fabricated on a part of a semiconductor wafer 41. The basic cell of the third embodiment has n-type source/drain regions, an n-type well and p-type source/drain regions similar to those of the first embodiment, and the n-type source/drain regions, the n-type well and the p-type source/drain regions are labeled with the same references designating corresponding areas of the first embodiment without detailed description.

Figure 18:
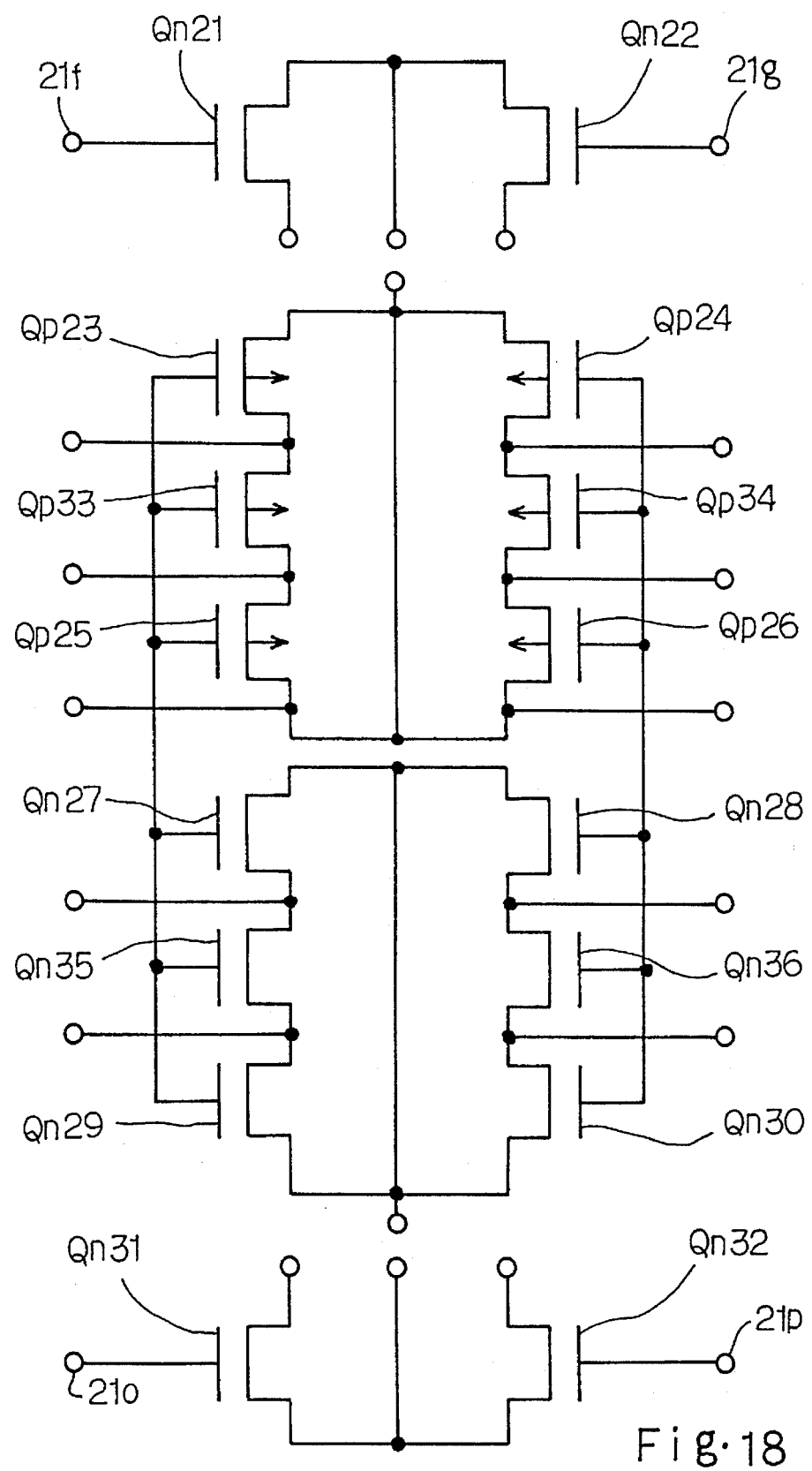
FIG. 18 is a circuit diagram showing an equivalent circuit of the basic cell shown in FIG. 17.

The n-type source/drain regions 21a and 21d are assigned to the n-channel type field effect transistors Qn21/Qn22 and the n-channel type field effect transistors Qn31/Qn32, respectively. However, not only the p-channel type field effect transistors Qp23/Qp24 and Qp25/Qp26 but also p-channel type field effect transistors Qp33/Qp34 are formed on the p-type source/drain regions 21e, and the n-type source/drain regions 21c are used for n-channel type field effect transistors Qn35/Qn36 as well as the n-channel type field effect transistors Qn27/Qn28 and Qn29/Qn30. The equivalent circuit of the basic cell is illustrated in FIG. 18 of the drawings.

The n-channel type field effect transistors Qn21/Qn22 and Qn31/Qn32 have respective gate electrodes 21f/21g and 21o/21p as similar to those of the first embodiment. However, a conductive strip 42a and a conductive strip 42b are shared between the field effect transistors Qp23/Qp33/Qp25/Qn27/Qn35/Qn29 and between the field effect transistors Qp24/Qp34/Qp26/Qn28/Qn36/Qn30. Namely, the conductive strip 42a provide gate electrodes 42aa, 42ab, 42ac, 42ad, 42ae and 42af for the field effect transistors Qp23/Qp33/Qp25/Qn27/Qn35/Qn29, and the conductive strip 42b provide gate electrodes 42ba, 42bb, 42bc, 42bd, 42be and 42bf for the field effect transistors Qp24/Qp34/Qp26/Qn28/Qn36/Qn30.

The gate electrodes 42aa to 42ac and the gate electrodes 42ba to 42bc are regulated in such a manner that the pairs of p-channel type field effect transistors Qp23/Qp24, Qp33/Qp34 and Qp25/Qp26 are different in gain from one another. Similarly, the gate electrodes 42ad to 42af and the gate electrodes 42*bd* to 42*bf* are regulated in such a manner that the pairs of n-channel type field effect transistors Qn27/Qn28, Qn35/Qn36 and Qn29/Qn30 are different in gain from one another. Thus, the three pairs of p-channel type field effect transistors different in gain are fabricated on the p-type source/drain regions 21*e* or the n-type source/drain regions 21*c*.

Figure 19:
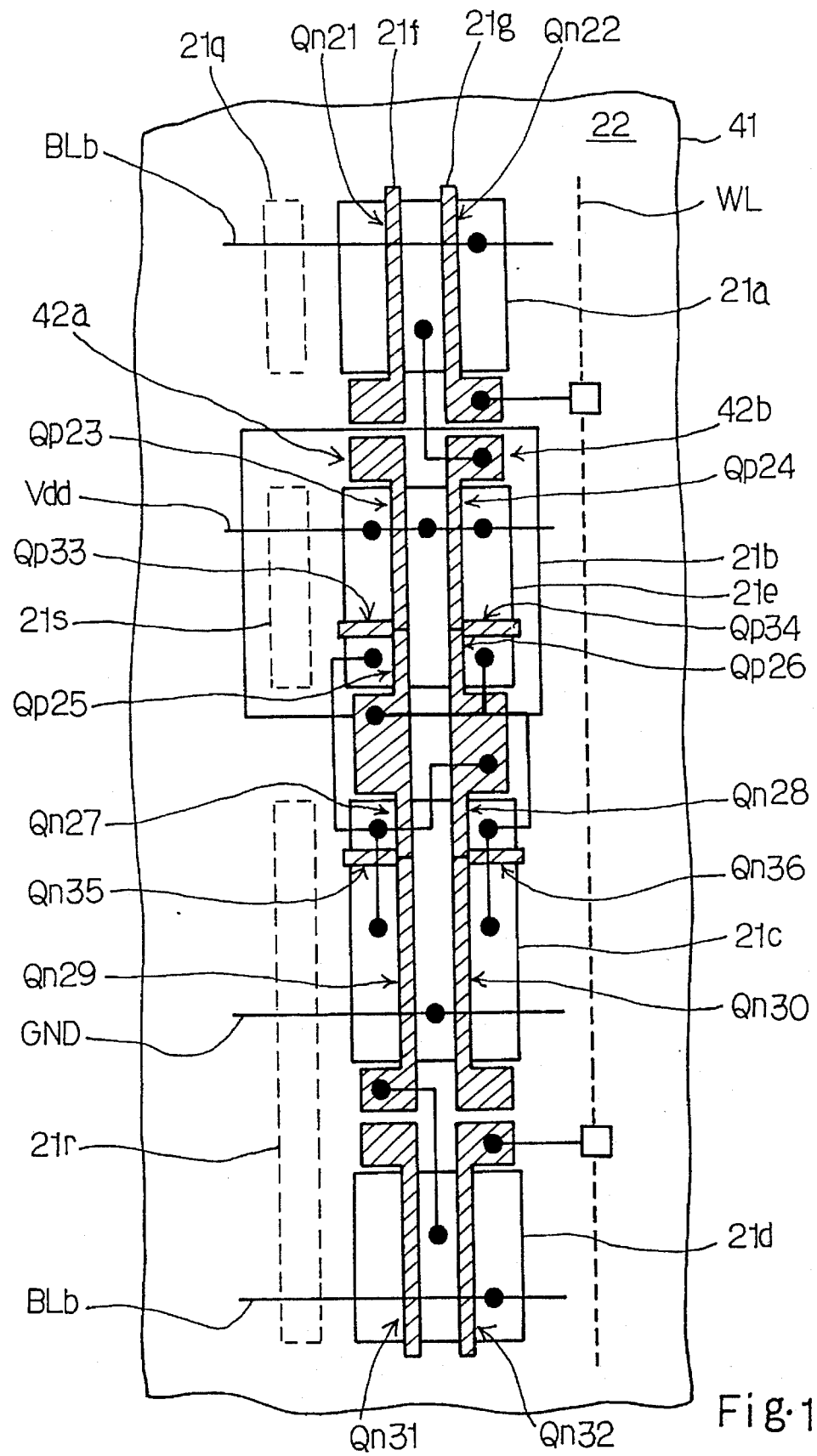
FIG. 19 is a plan view showing a wiring arrangement for a flip-flop type memory cell formed from the basic cell shown in FIG. 17.
Figure 20:
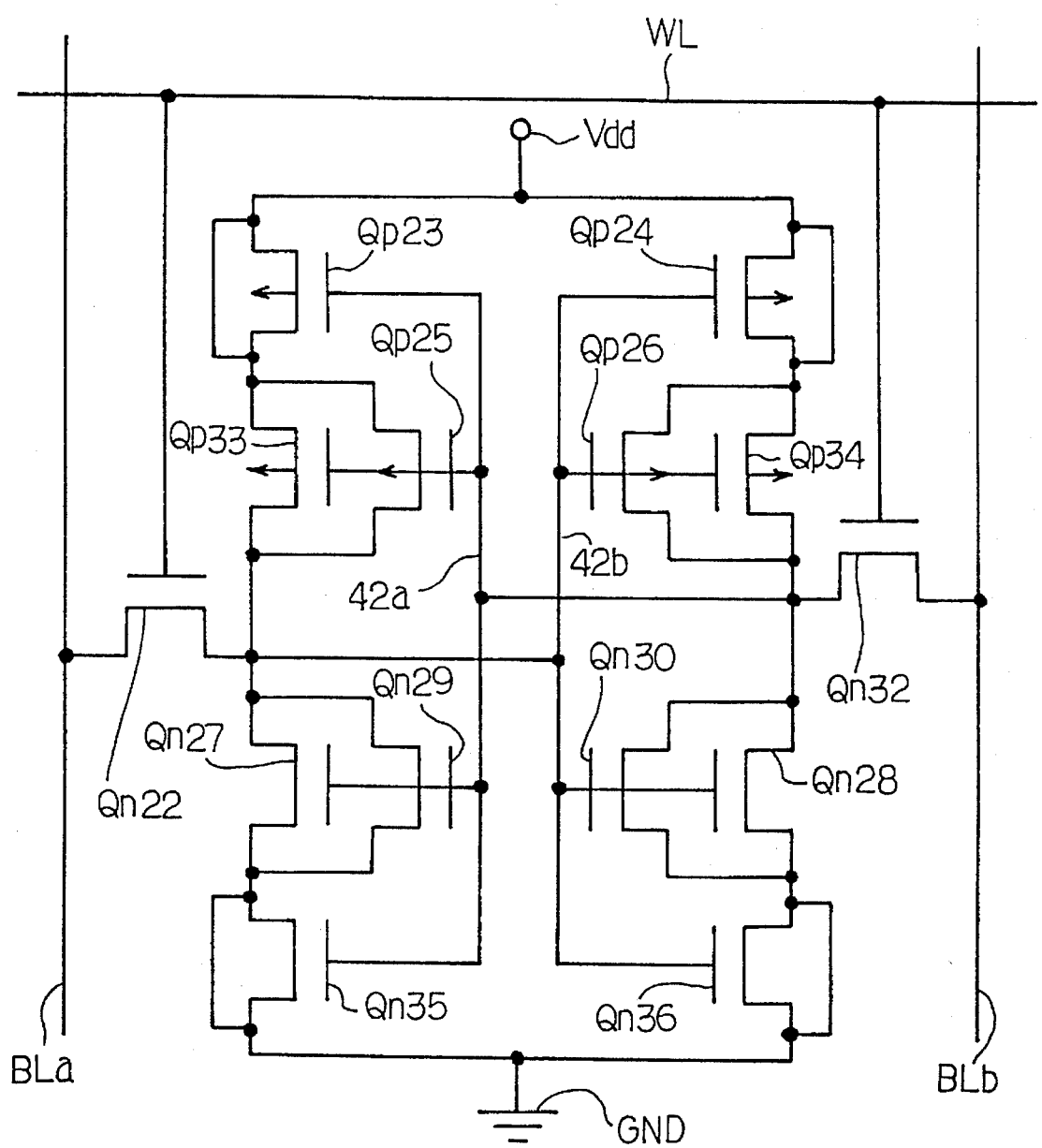
FIG. 20 is a circuit diagram showing an equivalent circuit of the flip-flop type memory cell shown in FIG. 19.

The basic cell is available for a flip-flop type memory cell and a logic gate. FIG. 19 illustrates a wiring arrangement for the flip-flop type memory cell. Real lines and a broken line respectively indicate first-level wirings and a second-level wiring, and dots and squares are representative of contact holes to the first-level wirings and contact holes to the second-level wiring. The positive power voltage line, the ground voltage line, the bit lines and the word line are labeled with Vdd, GND, BLa/BLb and WL.

The wiring arrangement shown in FIG. 19 realizes the flip-flop type memory cell. The p-channel type field effect transistor Qp33/Qp34 is coupled in parallel to the p-channel type field effect transistor Qp25/Qp26, and the p-channel type field effect transistors Qp23 and Qp24 are short circuited by connecting the source regions to the drain regions.

Similarly, the n-channel type field effect transistor Qn27/Qn28 is coupled in parallel to the n-channel type field effect transistor Qn29/Qn30, and the n-channel type field effect transistors Qn35 and Qn36 have respective source regions coupled to the respective drain regions.

Thus, the parallel combinations of the p-channel type field effect transistors Qp25/Qp33 and Qp26/Qp34 are coupled in series to the parallel combinations of the n-channel type field effect transistors Qn27/Qn29 and Qn28/Qn30 so as to form complementary inverters.

The complementary inverters are coupled in parallel between the positive power voltage line Vdd and the ground voltage line GND, and the n-channel type field effect transistors Qn22 and Qn32 are coupled between the bit lines BLa/BLb and the common drain nodes of the complementary inverters. The total channel width of the parallel combinations Qp25/Qp33 and Qp26/Qp34 is designed to be suitable for the charging paths of the flip-flop type memory cell, and the channel width of the n-channel type field effect transistors Qn22 and Qn32 is rather small than the total channel width of the parallel combinations. For this reason, the parasitic capacitance of the n-channel type field effect transistors Qn22 and Qn32 is decreased in comparison with the parasitic capacitance of the n-channel type field effect transistors of the prior art flip-flop type memory cell, and the switching action of the n-channel type field effect transistors Qn22 and Qn32 is accelerated.

Subsequently, description is made on a write-in function and a read-out function.

When a data bit is supplied to the pair of bit lines BLa/BLb, a potential difference takes place between the bit lines BLa and BLb. Firstly, the potential level on the bit line BLa is assumed to be higher than the potential level on the other bit line BLb.

The word line WL is changed to an active high level, and the n-channel type field effect transistors Qn22 and Qn32 concurrently turn on so as to transfer the potential difference on the bit line pair BLa/BLb to the conductive strips 42*b* and 42*a*. Then, the p-channel type field effect transistors Qp25/Qp33 turn on, and the other p-channel type field effect transistors Qp26/Qp34 turn off. On the other hand, the n-channel type field effect transistors Qn28 and Qn30 turn on, and the other n-channel type field effect transistors Qn27 and Qn29 turn off. The p-channel type field effect transistors Qp25/Qp33 supply the high potential level to the conductive strip 42*b*, and the n-channel type field effect transistors Qn28 and Qn30 supply the low potential level to the conductive strip 42*a*. The high potential level and the low potential level maintain the potential difference transferred from the bit line pair BLa/BLb, and the status of the field effect transistors Qp25/Qp33, Qp26/Qp34, Qn27/Qn28 and Qn29/Qn30 is not changed after a recovery of the word line WL. Thus, the potential difference indicating the data bit is stored in the flip-flop type memory cell.

If the data bit is represented by the high potential level on the bit line BLb and the low potential level on the bit line BLa, the p-channel type field effect transistors Qp26/Qp34 and the n-channel type field effect transistors Qn27/Qn29 turn on, and supply the high potential level and the low potential level to the conductive strips 42*a* and 42*b*, respectively. The status of the field effect transistors Qp25/Qp33, Qp26/Qp34, Qn27/Qn28 and Qn29/Qn30 is maintained after the recovery of the word line WL to the inactive low level, and the data bit represented by the opposite potential levels is stored in the flip-flop type memory cell.

The data bit is read out from the flip-flop type memory cell to the bit line pair BLa and BLb as follows. When the word line WL is changed to the active high level, the n-channel type field effect transistors Qn22 and Qn32 turn on, and the potential difference between the conductive strips 42*a* and 42*b* is transferred through the n-channel type field effect transistors Qn32 and Qn22 to the bit lines BLb and BLa.

The basic cell shown in FIG. 17 is available for the logic gate, and the field effect transistors Qp23/Qp24, Qp25/Qp26, Qn27/Qn28 and Qn29/Qn30 form in combination the logic gate. The p-channel type field effect transistors Qp23/Qp24 are respectively coupled in parallel to the p-channel type field effect transistors Qp25/Qp26, and the n-channel type field effect transistors Qn27/Qn28 are coupled in parallel to the n-channel type field effect transistors Qn29/Qn30. The parallel combinations are coupled as similar to the NAND gate shown in FIG. 4.

The wiring arrangement of the NAND gate of the third embodiment is simple by virtue of the conductive strips 42*a* and 42*b* serving as the gate electrodes of the field effect transistors Qp23, Qp25, Qn27/Qn29 and Qp24/Qp26/Qn28/Qn30. In this instance, the conductive strips 42*a* and 42*b* are generally T-letter shape. However, the gate electrodes may be a multiple configuration of the gate electrode of the field effect transistor Qp33 or Qn35.

Although particular embodiments of the present invention have been shown and described, it will be obvious to those skilled in the art that various changes and modifications may be made without departing from the spirit and scope of the present invention. For example, gate electrodes may be shared between large p-channel type field effect transistors and large n-channel type field effect transistors instead of the gate electrodes of the small transistors.

The present invention is applicable to any semicustom-made integrated circuit device.

Figure 21:
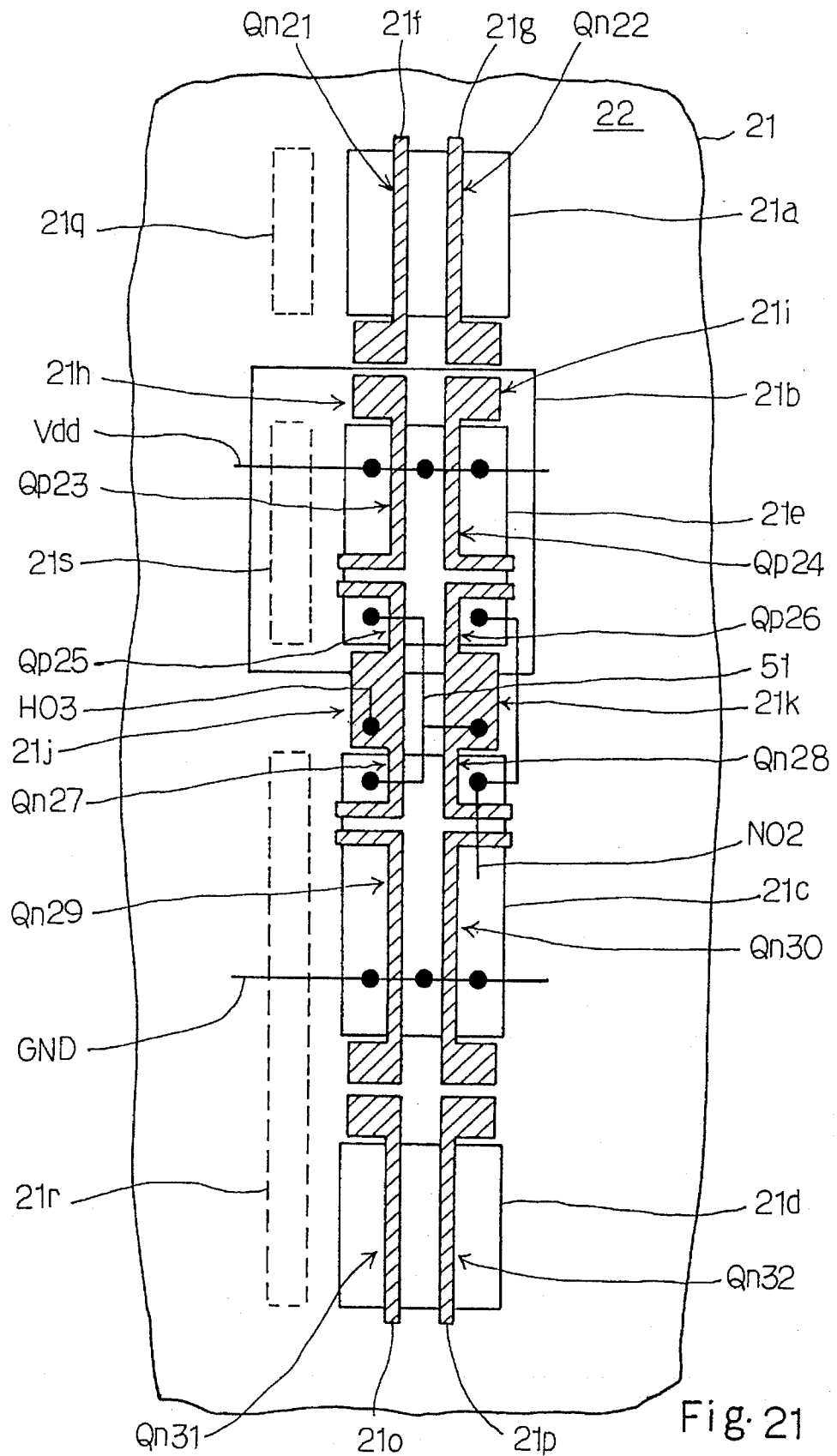
FIG. 21 is a plan view showing a wiring arrangement for an array of inverters.
Figure 22:
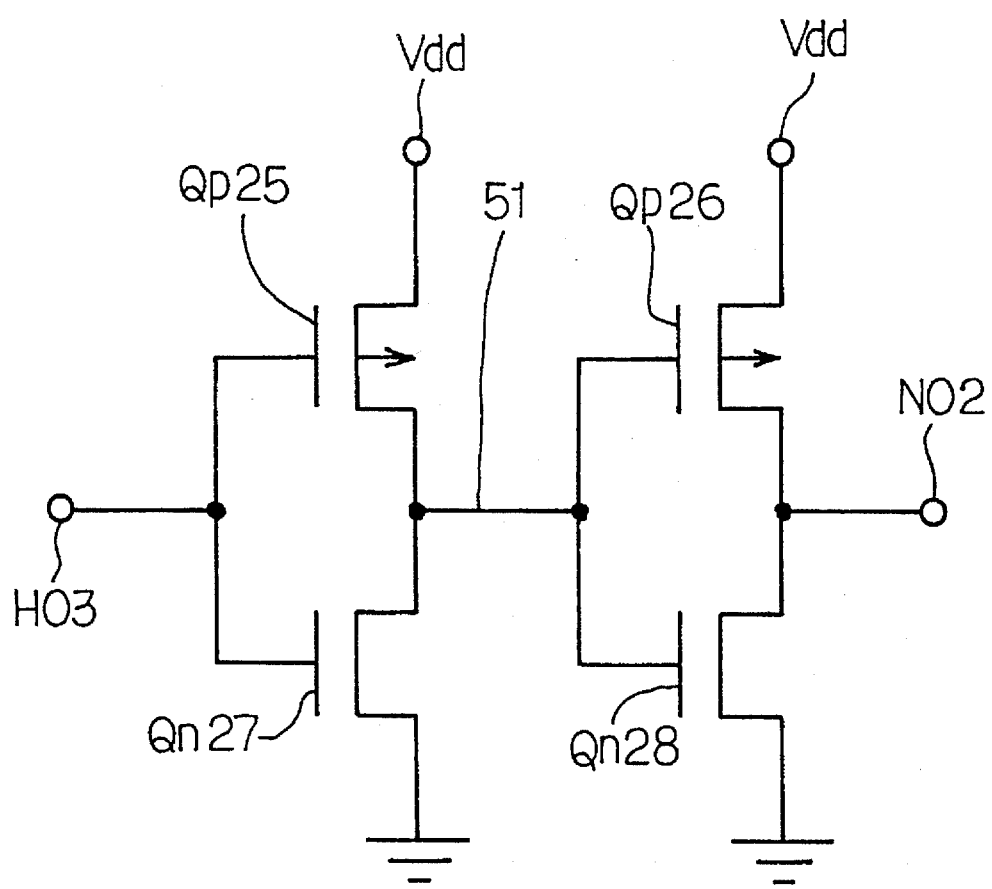
FIG. 22 is a circuit diagram showing an equivalent circuit of the array of inverters coupled in cascade.

The basic cell is available for another electric circuit. The basic cell of the first embodiment is, by way of example, available for an array of inverters as shown in FIG. 21, and the inverters coupled in cascade serve as a delay circuit. An input is supplied from an input signal line H03 to the conductive strip 21*j*, and the small p-channel type field effect transistor Qp25 and the small n-channel type field effect transistor Qn27 form the first-stage inverter. The drains of the first-stage inverter are coupled through a wiring 51 to the conductive strip 21*k*. The small p-channel type field effect transistor Qp26 and the small n-channel type field effect transistor Qn28 form the second-stage inverter, and the drains of the field effect transistors Qp26 and Qn28 is coupled to an output line NO2. The equivalent circuit is illustrated in FIG. 22. The field effect transistors Qp25, Qn27, Qp26 and Qn28 are smaller in channel width than the other field effect transistors forming the fundamental logic, and long time delay is introduced into propagation of the signal supplied to the input wiring H03.

Figure 23:
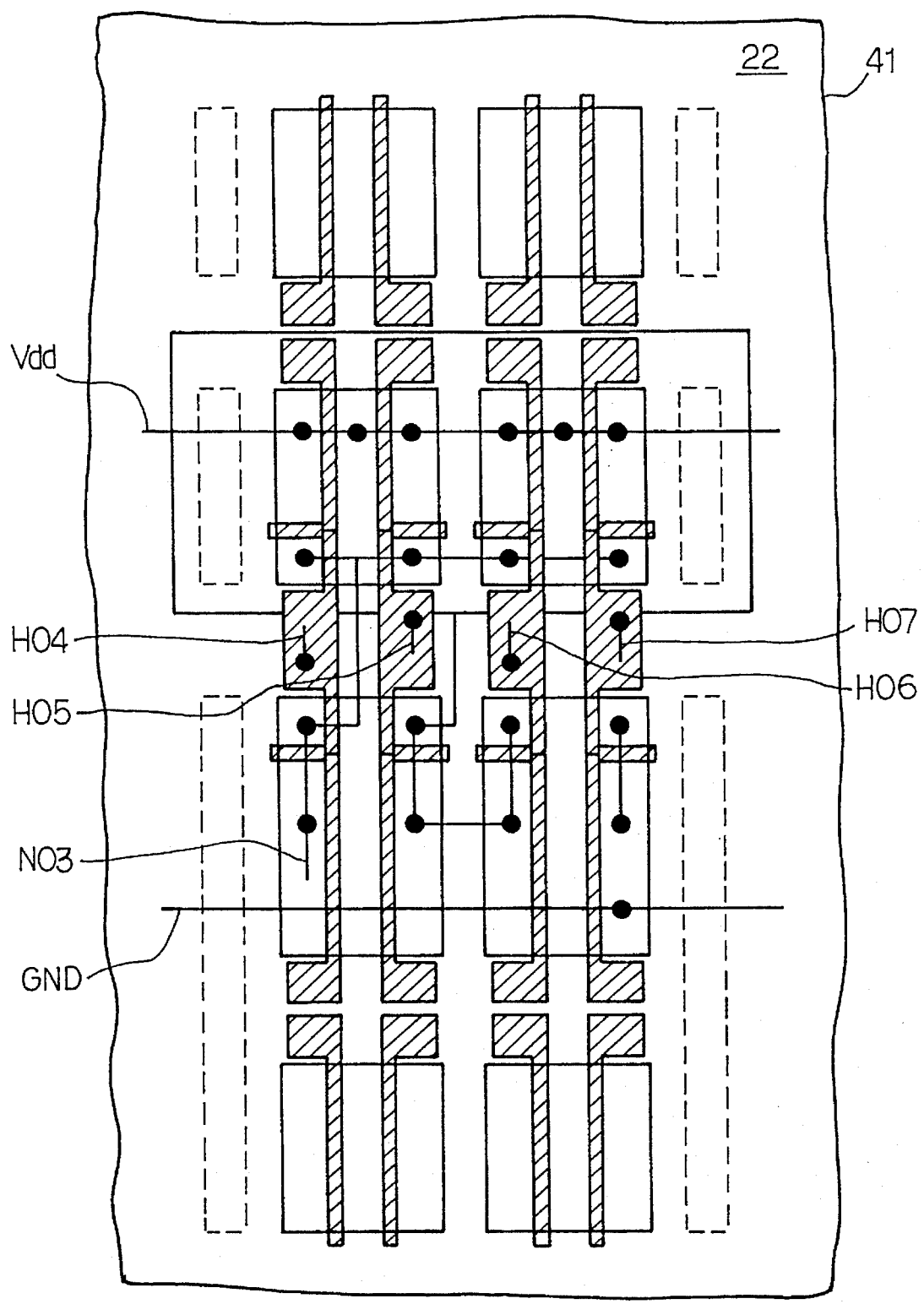
FIG. 23 is a plan view showing a wiring arrangement for a four-input NAND gate.
Figure 24:
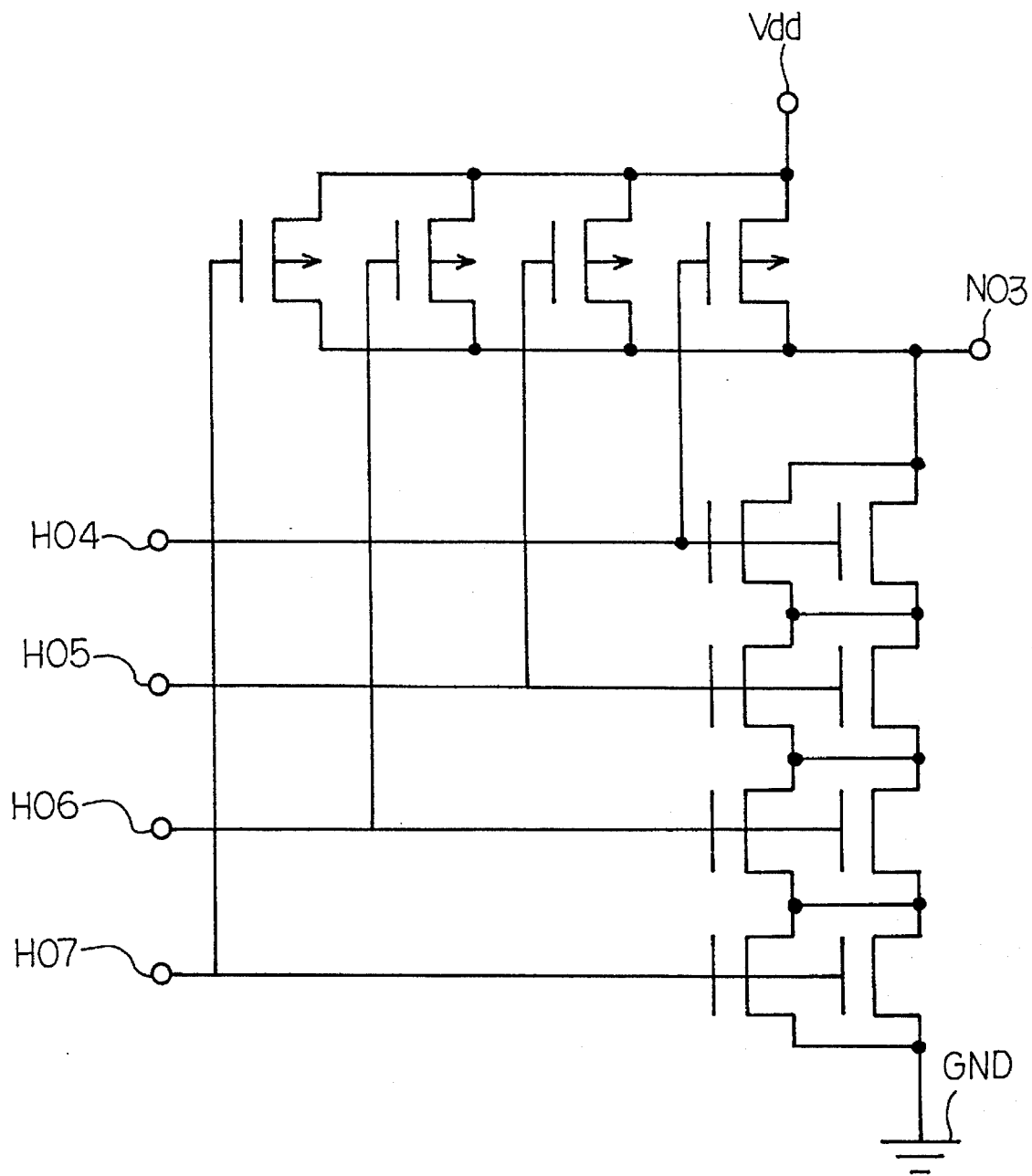
FIG. 24 is a circuit diagram showing an equivalent circuit of the four-input NAND gate.

A four-input NAND gate is fabricated from two basic cells as shown in FIG. 23. The basic cell is of the type shown in FIG. 17. The four input signals are supplied from input signal wirings H04, H05, H06 and H07, and the four-input NAND gate yields an output signal on an output signal line N03. The small p-channel type field effect transistors are coupled in parallel between the positive power voltage line Vdd and the output signal line N03, and the large n-channel type field effect transistors are coupled in series between the output signal line N03 and the ground voltage line GND. As a result, the current driving capability of the parallel combination of the p-channel type transistors is close to the current driving capability of the series combination of the n-channel type transistors, and the rise time is equal to the decay time.

What is claimed is:

1. A semiconductor semicustom-made integrated circuit device fabricated on a semiconductor substrate of a first conductivity type and comprising at least one basic cell available for circuit configurations different from one another, said at least one basic cell including:

a first source and drain area formed in a first area of said semiconductor substrate and having a first sub-area of a second conductivity type opposite to said first conductivity type and a second sub-area of said second conductivity type contiguous to said first sub-area;

a first pair of gate electrodes provided over said first sub-area for forming a first pair of transistors having a first common impurity region shared between transistors of said first pair;

a second pair of gate electrodes provided over said second sub-area for forming a second pair of transistors different in channel width from said first pair of transistors and having a second common impurity region shared between transistors of said second pair and contiguous to said first common impurity region;

a well of said second conductivity type formed in a second area of said semiconductor substrate spaced from said first source and drain area;

a second source and drain area of said first conductivity type formed in said well and having a third sub-area and a fourth sub-area contiguous to said third sub-area;

a third pair of gate electrodes provided over said third sub-area for forming a third of transistors having a third common impurity region shared between transistors of said third pair, gate electrodes of said third pair being respectively connected to gate electrodes of said second pair; and a fourth pair of gate electrodes provided over said fourth sub-area for forming a fourth pair of transistors different in channel width from said third pair of transistors and having a fourth common impurity region shared between transistors of said fourth pair.

2. The semiconductor semicustom-made integrated circuit device as set forth in claim 1, in which said at least one basic cell further includes a third source and drain area of said second conductivity type formed in a third area of said semiconductor substrate spaced from said first and second areas, a fifth pair of gate electrodes provided over said third source and drain area for forming a fifth pair of transistors smaller in channel width than said first and second pairs of transistors, a fourth source and drain area of said second conductivity type formed in a fourth area of said semiconductor substrate spaced from said first, second and third areas, and a sixth pair of gate electrodes provided over said fourth source and drain area for forming a sixth pair of transistors smaller in channel width than said first and second pairs of transistors.

3. The semiconductor semicustom-made integrated circuit device as set forth in claim 1, in which each gate electrode of said first pair of gate electrodes has a long portion, a short portion and a curved corner merged with said long portion and said short portion.

4. The semiconductor semicustom-made integrated circuit device as set forth in claim 3, in which each gate electrode of said second pair of gate electrodes has a long portion, a short portion and a curved corner merged with said long portion and said short portion, said short portions of said second pair of gate electrodes being opposed to said short portions of said first pair of gate electrodes.

5. The semiconductor semicustom-made integrated circuit device as set forth in claim 1, in which said third pair of gate electrodes has a third pair of gate electrodes each having a long portion, a short portion and a curved corner merged with said long portion and said short portion.

6. The semiconductor semicustom-made integrated circuit device as set forth claim 5 in which said fourth pair of gate electrode has a fourth pair of gate electrodes each having a long portion, a short portion and a curved corner merged with said long portion and said short portion, said short portions of said fourth pair of gate electrodes being opposed to said short portions of said third pair of gate electrodes.

7. The semiconductor semicustom-made integrated circuit device as set forth in claim 2, in which said pair of second transistors and said third pair of transistors are used for forming a logic gate, and in which said first pair of transistors, said second pair of transistors, said third pair of transistors, said fourth pair of transistors, said fifth pair of transistors and said sixth pair of transistors are used for forming a flip-flop type memory cell.

8. The semiconductor semicustom-made integrated circuit device as set forth in claim 1, in which a fifth pair of gate electrodes and a sixth pair of gate electrodes are respectively provided over a fifth sub-area of said first source and drain area and a sixth sub-area of said second source and drain area for forming a fifth pair of transistors and a sixth pair of transistors, respectively.

9. The semiconductor semicustom-made integrated circuit device as set forth in claim 8, in which said first pair of gate electrodes, said second pair of gate electrodes, said third pair of gate electrodes, said fourth pair of gate electrodes, said fifth pair of gate electrodes and said sixth pair of gate electrodes have first gate electrodes, second gate electrodes, third gate electrodes, fourth gate electrodes, fifth gate electrodes and sixth gate electrodes, respectively, one of said first gate electrodes, one of said second gate electrodes, one of said third gate electrodes, one of said fourth gate electrodes, one of said fifth gate electrodes and one of said sixth gate electrodes being formed in a patterned conductive strip, another of said first gate electrodes, another of said second gate electrodes, another of said third gate electrodes, another of said fourth gate electrodes, another of said fifth gate electrodes and another of said sixth gate electrodes being formed in another patterned conductive strip.

10. The semiconductor semicustom-made integrated circuit device as set forth in claim 9, in which said at least one basic cell further includes:

a third source and drain area of said second conductivity type formed in a third area of said semiconductor substrate spaced from said first and second areas, a seventh pair of gate electrodes provided over said third source and drain area for forming a seventh pair of transistors smaller in channel width than said first and second pairs of transistors, a fourth source and drain area of said second conductivity type formed in a fourth area of said semiconductor substrate spaced from said first, second and third areas, and an eighth pair of gate electrodes provided over said fourth source and drain area for forming an eighth pair of transistors smaller in channel width than said first and second pairs of transistors.

11. The semiconductor semicustom-made integrated circuit device as set forth in claim 10, in which said first pair of transistors, said second pair of transistors, said third pair of transistors and said fourth pair of transistors are used for forming a logic gate, and in which said second pair of transistors, said third pair of transistors, said fourth pair of transistors, said fifth pair of transistors, said sixth pair of transistors, said seventh pair of transistors and said eighth pair of transistors are used for forming a flip-flop type memory cell.

* * * * *